(12) United States Patent
Pan et al.

(10) Patent No.: US 11,621,726 B1
(45) Date of Patent: Apr. 4, 2023

(54) MULTIDIMENSIONAL MULTILEVEL CODING ENCODER AND DECODER

(71) Applicant: HUAWEI TECHNOLOGIES CO., LTD., Guangdong (CN)

(72) Inventors: Chunpo Pan, Ottawa (CA); Deyuan Chang, Kanata (CA); Frank Robert Kschischang, Mississauga (CA); Yoones Hashemi Toroghi, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/471,765

(22) Filed: Sep. 10, 2021

(51) Int. Cl.
| | |
|---|---|
| H03M 13/25 | (2006.01) |
| H03M 13/29 | (2006.01) |
| H04L 27/34 | (2006.01) |
| H03M 13/45 | (2006.01) |
| H03M 13/39 | (2006.01) |
| H04L 1/00 | (2006.01) |

(52) U.S. Cl.
CPC ..... *H03M 13/253* (2013.01); *H03M 13/2906* (2013.01); *H03M 13/39* (2013.01); *H03M 13/45* (2013.01); *H04L 1/0041* (2013.01); *H04L 27/34* (2013.01)

(58) Field of Classification Search
CPC ................................................. H03M 13/253
See application file for complete search history.

(56) References Cited

U.S. PATENT DOCUMENTS 5,048,057 A * 9/1991 Saleh .................... H04L 27/186
455/60
6,266,795 B1 * 7/2001 Wei ...................... H03M 13/256
714/755

(Continued)

FOREIGN PATENT DOCUMENTS

CN          112564857 A          3/2021

OTHER PUBLICATIONS

Imai et al., "A new multilevel coding method using error-correcting codes", IEEE Transactions on Information Theory, vol. 23, No. 3, pp. 371-377, May 1977.

(Continued)

*Primary Examiner* — Joseph D Torres
(74) *Attorney, Agent, or Firm* — BCF LLP

(57) ABSTRACT

A multidimensional multilevel coding (MLC) encoder comprises a soft forward error correction (FEC) encoder receiving first bits for generating soft FEC encoded bits, a redundancy generator receiving a subset of the soft FEC encoded bits for generating redundant bits, and a hard FEC encoder receiving second bits for generating hard FEC encoded bits. Combinations of the soft FEC encoded bits, the redundant bits, and the hard FEC encoded bits form labels for mapping to a plurality of constellation points. A MLC decoder comprises a redundancy decoder, a soft FEC decoder and a hard FEC decoder. The redundancy decoder combines log-likelihood-ratios (LLR) of soft FEC encoded bits received from the MLC encoder to allow the soft FEC decoder to produce decoded bits. Decoding of hard FEC encoded bits by the (Continued)

hard FEC decoder is conditioned on values of the bits decoded by the soft FEC decoder.

11 Claims, 18 Drawing Sheets

(56) References Cited

U.S. PATENT DOCUMENTS

| | | |
|---|---|---|
| 2008/0192851 A1* | 8/2008 | Golitschek Edler Elbwart ........... H04L 27/34 375/261 |
| 2016/0028417 A1 | 1/2016 | Yu et al. |
| 2016/0087649 A1 | 3/2016 | Limberg |
| 2019/0190651 A1 | 6/2019 | Oveis Gharan et al. |
| 2020/0177307 A1 | 6/2020 | Pan |

OTHER PUBLICATIONS

Ungerboeck, "Channel coding with multilevel/phase signals", IEEE Transactions on Information Theory, vol. 28, No. 1, pp. 55-67, Jan. 1982.

Wachsmann et al., "Multilevel codes: theoretical concepts and practical design rules", IEEE Transactions on Information Theory, vol. 45, No. 5, pp. 1361-1391, Jul. 1999.

Forney, "Coset codes. II. Binary lattices and related codes", IEEE Transactions on Information Theory, vol. 34, No. 5, pp. 1152-1187, Sep. 1988.

Cho et al., "Probabilistic Constellation Shaping for Optical Fiber Communications", Journal of Lightwave Technology, vol. 37, No. 6. pp. 1590-1607, 2019.

Barakatain et al., "Performance-Complexity Tradeoffs of Concatenated FEC for Higher-Order Modulation," Journal of Lightwave Technology, vol. 38, No. 11, pp. 2944-2953, Jun. 2020.

International Search Report of PCT/CN2022/118288; Jingwei Liu; dated Nov. 25, 2022.

* cited by examiner

MULTIDIMENSIONAL MULTILEVEL CODING ENCODER AND DECODER

CROSS-REFERENCE TO RELATED APPLICATIONS

This is the first application filed for the instantly disclosed technology.

TECHNICAL FIELD

The present disclosure generally relates to the field of communication networks and, in particular, to a multidimensional multilevel coding encoder and a multidimensional multilevel coding decoder.

BACKGROUND

Optical fiber transmission is characterized by a large information capacity, interference immunity, a high transmission speed, and other advantages, and has become a dominant data transmission mode in current communications systems. When an optical fiber transmission system is used for data transmission, a transmitter performs forward error correction (FEC) coding on the data before its transmission, modulates a baseband signal obtained after FEC coding, and transmits the modulated signal on an optical fiber toward a receiver. The receiver demodulates the received data to restore the baseband signal, performs analog-to-digital conversion on the baseband signal to obtain a digital signal, applies a digital processing algorithm on the digital signal and performs FEC decoding on the received data to recover the data transmitted by the transmitter.

As optical fiber transmission rates increase from 100 gigabits per second (Gb/s) to 200 Gb/s, or even up to 800 Gb/s, an amount of data that needs to be processed in FEC decoding is also increasingly high, and power consumption required by FEC decoding also constantly increases. Soft FEC decoders use an iterative decoding mode. A predetermined number of iterations for each codeword may be set and a decoding result of the codeword is output after iterative decoding is performed on each codeword for the predetermined number of iterations. Practical soft FEC decoders usually have greater error correcting capabilities than hard FEC decoders. However, because they rely on pluralities of iterations, soft FEC decoders typically consume more than 10 times, if not 100 times, the power consumed by hard FEC decoders operating at the same signal to noise ratio (SNR).

Consequently, there is a desire for coding and decoding techniques that benefit from the superior error decoding capabilities of soft FEC decoders while limiting their power consumption.

SUMMARY

Embodiments of the present technology have been developed based on developers' appreciation of shortcomings associated with the prior art. In particular, such shortcomings may comprise the high complexity and important power consumption of conventional demodulation and decoding using soft forward error correction.

A first object of the present disclosure is to provide a multidimensional multilevel coding (MLC) encoder, comprising:

- a soft forward error correction (FEC) encoder configured to receive a first set of bits for generating a first set of soft FEC encoded bits;
- a redundancy generator configured to receive a subset of the first set of soft FEC encoded bits for generating redundant bits; and
- a hard FEC encoder configured to receive a second set of bits for generating a second set of hard FEC encoded bits;
- combinations of (a) the first set of soft FEC encoded bits, (b) the redundant bits, and (c) the second set of hard FEC encoded bits forming a plurality of labels for mapping to a plurality of constellation points.

In some implementations of the present technology, the first set of soft FEC encoded bits comprises most significant bits (MSB) of the labels; the second set of hard FEC encoded bits comprises least significant bits (LSB) of the labels; the redundancy generator is a repeater configured to generate, as a redundant bit, a copy of one third of the first set of soft FEC encoded bits; and a pair of associated labels comprises: a first label including a first MSB of a first label, a second MSB of the first label, and two or more LSBs of the first label, and a second label including a copy of the first MSB of the first label, a second MSB of a second label, and two or more LSBs of the second label.

In some implementations of the present technology, the bits of the first set of bits received at the soft FEC encoder are selected so that a first minimum Euclidian distance $d'_{min}$ between two labels having the same MSB is greater than a second minimum Euclidian distance $d_{min}$ between the constellation points and so that a third minimum Euclidian distance $d''_{min}$ between two labels having the same 2 MSBs is greater than the first minimum Euclidian distance $d'_{min}$.

In some implementations of the present technology, the constellation points map on a modulation scheme selected from 16-quadrature amplitude modulation (QAM), 32-QAM, 64-QAM, 128-QAM, 256-QAM, 512-QAM and 1024-QAM.

In some implementations of the present technology, the first set of soft FEC encoded bits comprises most significant bits (MSB) of the labels; the second set of hard FEC encoded bits comprises least significant bits (LSB) of the labels; the redundancy generator is a single parity check encoder configured to apply a single parity check code of length 3 to two fifths of the first set of soft FEC encoded bits for generating, as a redundant bit, a parity bit; and three associated labels comprise: a first label including a first MSB of the first label, a second MSB of the first label, and two or more LSBs of the first label, a second label including a first MSB of the second label, a second MSB of the second label, and two or more LSBs of the second label, and a third label including the parity bit, a second MSB of the third label, and two or more LSBs of the third label.

In some implementations of the present technology, the first set of soft FEC encoded bits comprises most significant bits (MSB) of the labels; the second set of hard FEC encoded bits comprises least significant bits (LSB) of the labels; the redundancy generator is a repeater configured to apply a repetition code length 3 to one fourth of the first set of soft FEC encoded bits for generating, as redundant bits, first and second parity bits; and three associated labels comprise: a first label including a first MSB of the first label, a second MSB of the first label, and two or more LSBs of the first label, a second label including the first parity bit, a second MSB of the second label, and two or more LSBs of the second label, and a third label including the second parity bit, a second MSB of the third label, and two or more LSBs of the third label.

In some implementations of the present technology, the MLC encoder further comprises a probabilistic constellation shaping (PCS) encoder configured to: receive a third set of bits, and generate the second set of bits received at the hard FEC encoder; wherein: the first set of bits have an equal probability of being zeroes or ones, the third set of bits have an equal probability of being zeroes or ones, the second set of bits are generated with an unequal probability of being zeroes or ones, a number of generated bits in the second set of bits is greater than a number of received bits in the third set of bits, and the hard FEC encoder is further configured to generate parity bits made part of the first set of bits received at the soft FEC encoder.

In some implementations of the present technology, the first set of bits received at the soft FEC encoder is a first set of hard FEC encoded bits encoded by the hard FEC encoder.

In some implementations of the present technology, the first set of bits received at the soft FEC encoder is a first set of hard FEC encoded bits encoded by the hard FEC encoder.

In some implementations of the present technology, the first set of soft FEC encoded bits comprises bits of the labels in first bit locations; the second set of hard FEC encoded bits comprises bits of the labels in second bit locations; the redundancy generator is a repeater configured to generate a copy of one half of the first set of soft FEC encoded bits; and a pair of associated labels comprises: a first label including a first bit of a first label in one of the first bit locations, a second bit of the first label in another one of the first bit locations, and two or more bits of the first label in the second bit locations, and a second label including a copy of the first bit of the first label in one of the first bit locations, a second bit of the second label in another one of the first bit locations, and two or more bits of the second label in the second bit locations.

A second object of the present disclosure is to provide a transmitter, comprising:
  any implementation of the above-described MLC encoder; and
  a modulator configured to receive the labels from the MLC encoder and to modulate a carrier by mapping the labels to the constellation points.

A third object of the present disclosure is to provide a multidimensional multilevel coding (MLC) decoder, comprising:
  a redundancy decoder configured to receive log-likelihood-ratios (LLR) of a first set of soft forward error correction (FEC) encoded bits and to combine LLR values of two or more encoded bits of the first set to calculate an improved LLR value;
  a soft FEC decoder configured to:
    receive the improved LLR value and produce a first decoded bit,
    receive an LLR value of a third encoded bit of the first set of soft FEC encoded bits and produce a second decoded bit, the LLR value of the third encoded bit being conditioned on a value of the first decoded bit,
    receive an LLR value of a fourth encoded bit of the first set of soft FEC encoded bits and produce a third decoded bit, the LLR value of the fourth encoded bit being conditioned on the value of the first decoded bit; and
  a hard FEC decoder configured to receive hard estimates of a second set of hard FEC encoded bits and to produce decoded values of the second set of hard FEC encoded bits, the hard estimates being conditioned on values of the first and second decoded bit values.

In some implementations of the present technology, the first set of soft FEC encoded bits comprises most significant bits (MSB) of labels mappable to constellation points; the second set of hard FEC encoded bits comprises least significant bits (LSB) of the labels; and a pair of associated labels comprises: a first label including the first decoded bit as a first MSB, the second decoded bit as a second MSB, and two or more bits of the second set of hard FEC encoded bits as LSBs, and a second label including the first decoded bit as a first MSB, the third decoded bit as a second MSB, and two or more bits of the second set of hard FEC encoded bits as LSBs.

In some implementations of the present technology, the first set of soft FEC encoded bits comprises most significant bits (MSB) of labels mappable to constellation points; the second set of hard FEC encoded bits comprises least significant bits (LSB) of the labels; and three associated labels comprise: a first label including the first decoded bit as a first MSB of the first label, the second decoded bit as a second MSB of the first label, and two or more bits of the second set of hard FEC encoded bits as LSBs of the first label, a second label including a first MSB of the second label, a second MSB of the second label, and two or more bits of the second set of hard FEC encoded bits as LSBs of the second label, and a third label including a parity bit output by the redundancy decoder, wherein the redundancy decoder is a single parity check decoder, the parity bit being based on a single parity check code of length 3 applied to two fifths of the first set of soft FEC encoded bits, the third label also including the third decoded bit as a second MSB of the third label, and two or more bits of the second set of hard FEC encoded bits as LSBs of the third label.

In some implementations of the present technology, the first set of soft FEC encoded bits comprises most significant bits (MSB) of labels mappable to constellation points; the second set of hard FEC encoded bits comprises least significant bits (LSB) of the labels; and three associated labels comprise: a first label including the first decoded bit as a first MSB of the first label, the second decoded bit as a second MSB of the first label, and two or more bits of the second set of hard FEC encoded bits as LSBs of the first label, a second label including, as a first parity bit, a copy of the first decoded bit output by the soft FEC decoder based on a repetition code of length 3 applied to one fourth of the first set of soft FEC encoded bits, the third decoded bit as a second MSB of the second label, and two or more bits of the second set of hard FEC encoded bits as LSBs of the second label, and a third label including, as a second parity bit, another copy of the first decoded bit output by the repetition code module based on the repetition code of length 3 applied to the one fourth of the first set of soft FEC encoded bits, a second MSB of the third label, and two or more LSBs of the third label.

In some implementations of the present technology, a probabilistic constellation shaping (PCS) decoder configured to receive the decoded values of the second set of hard FEC encoded bits and generate a third set of decoded bits; wherein: the soft FEC decoder is further configured to produce hard FEC parity bits from the LLRs of a first set of soft FEC encoded bits, the hard FEC decoder is further configured to use the hard FEC parity bits to produce the decoded values of the second set of hard FEC encoded bits, the encoded bits of the first set have an equal probability of being zeroes or ones, the decoded bits of the third set have an equal probability of being zeroes or ones, the encoded bits of the second set have an unequal probability of being zeroes or ones, and a number of bits of the third set of decoded bits is less than a number of decoded values of the second set of hard FEC encoded bits.

In some implementations of the present technology, the first, second and third bits decoded by the soft FEC decoder are hard FEC encoded bits; and the hard FEC decoder is further configured to decode the hard FEC encoded bits from the soft FEC encoder.

In some implementations of the present technology, the first, second and third bits decoded by the soft FEC decoder are hard FEC encoded bits; and the hard FEC decoder is further configured to decode the hard FEC encoded bits from the soft FEC encoder.

In some implementations of the present technology, the first set of soft FEC encoded bits comprises bits of labels mappable to first bit locations of constellation points; the second set of hard FEC encoded bits comprises bits of the labels mappable to second bit locations of the constellation points; and a pair of associated labels comprises: a first label including the first decoded bit as a first bit of the first label in one of the first bit locations, the second decoded bit as a second bit of the first label in another one of the first bit locations, and two or more bits of the second set of hard FEC encoded bits as bits of the first label in the second bit locations, and a second label including the first decoded bit as a first bit of the second label in one of the first bit locations, the third decoded bit as a second bit of the second label in another one of the first bit locations, and two or more bits of the second set of hard FEC encoded bits as bits of the second label in the second bit locations.

A fourth object of the present disclosure is to provide a receiver, comprising:
  any implementation of the above-described MLC decoder; and
  a demodulator configured to:
    receive a modulated carrier carrying the first and second set of hard FEC encoded bits,
    demodulate the carrier,
    calculate the LLRs of the first set of soft FEC encoded bits, and
    calculate the hard estimates of the second set of hard FEC encoded bits.

BRIEF DESCRIPTION OF THE FIGURES

The features and advantages of the present disclosure will become apparent from the following detailed description, taken in combination with the appended drawings, in which:

FIG. 11 is an example of 64-QAM labeling scheme that may benefit from 4D 3-level MLC encoding and decoding in accordance with an embodiment of the present technology;

Figure 1:
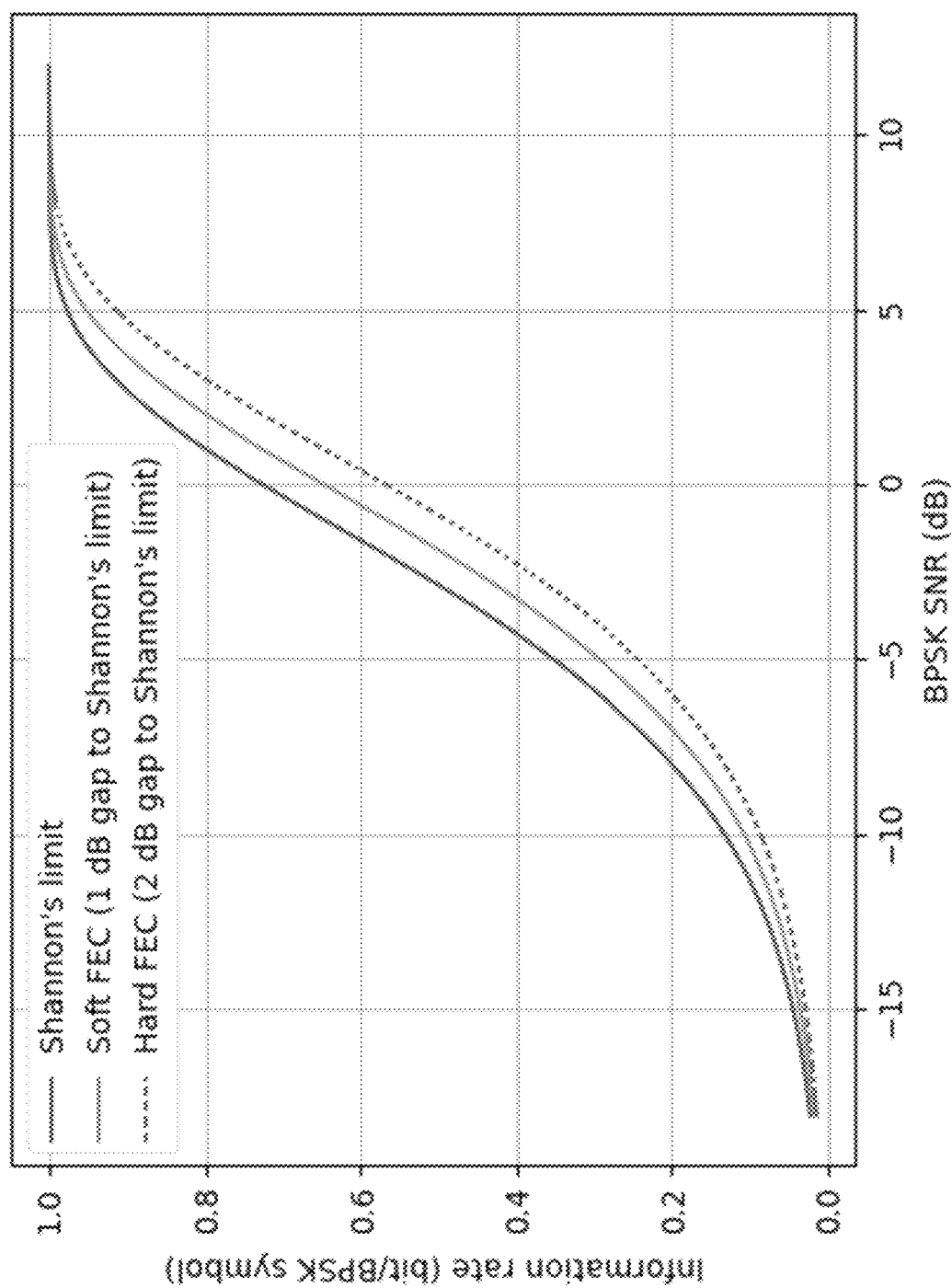
FIG. 1 is an example of attainable information rates as a function of signal to noise ratio (SNR) for both hard and soft forward error correction (FEC) technologies.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Unless otherwise defined, all technical and scientific terms used herein have the same meaning as commonly understood by one of ordinary skill in the art to which the described embodiments appertain to.

In coherent optical communication systems, forward-error-correction (FEC) is often used to protect the data and correct the errors caused by channel noises and impairments. Without loss of generality, the present disclosure focusses on systematic binary FEC schemes, in which a FEC codeword is a collection of bits, and the information bits also appear in the encoded codeword. In a codeword, the information bits are the client data that need to be transmitted through the optical channel, and the parity bits are redundant bits that are computed by the FEC encoder based on the information bits. The parity bits do not carry any information that is not contained in the information bits, as their role is to protect the information bits against noise and corruption. The proportion of information bits in each codeword is defined as the code rate of a FEC scheme; the ratio between the number of parity bits and the number of information bits is defined as the overhead (OH) of a FEC scheme. The available FEC schemes can be categorized as soft-decision FEC (soft FEC) or hard-decision FEC (hard FEC). This categorization is based on whether the decoder is able to utilize the information of how reliable a received bit is, which is often referred to as the soft information. With binary FEC, the soft information is usually the log-likelihood-ratio (LLR) of a bit. The LLR of a bit b is defined as $$LLR(b) = \log \frac{p(b=0)}{p(b=1)},$$

in which p(b=x) is the probability for the bit b to be x∈{0,1}. The LLR's are often produced by a demodulator module that compares the received complex symbol with all possible transmitted symbols of a constellation for a given modulation scheme. The sign of the LLR determines whether the bit is more likely to be 0 (positive) or 1 (negative). The magnitude of the LLR is a measure of how confident the demodulator is on having the correct sign. A soft FEC is able to correct errors in the received bit stream based on the LLRs. In contrast, a hard FEC can only correct errors based on the bit values. With the same code rate or OH, carefully designed soft FECs usually have greater error correcting capabilities, while hard FECs usually exhibit lower decoding complexity and power consumption.

One common metric used to measure a FEC scheme's error correcting capability is its gap to Shannon's limit. In the context of the present disclosure, Shannon's limit is defined as the mutual information (MI) between the input (bit or symbol) and output (bit or symbol, respectively) of a channel given an input distribution and a signal to noise ratio (SNR), measured in decibels (dB). Shannon's limit is the maximum amount of information that can be reliably transmitted through the channel, per channel usage (per transmitted bit or per transmitted symbol). In the definition of Shannon's limit, information is said to be reliably transmitted when the decoded information bits have an arbitrarily small bit error rate (BER), defined as the proportion of bits that are in error. In practice, for optical communication systems, reliable communication is achieved if the decoded information bits have a BER<$10^{-15}$. The gap of the FEC to Shannon's limit is often measured in dB, and is defined as the required SNR increase, relative to Shannon's limit, to achieve the same information rate. In the case of binary-phase-shifted-keying (BPSK) modulation with equal-probability-signaling, the information rate is equal to the code rate of the FEC scheme if reliable communication is achieved by a FEC scheme and if there is no other OH in the system.

The present disclosure defines another metric used to evaluate a FEC scheme's efficiency as its rate loss compared to Shannon's limit. The rate loss of the FEC is defined as the FEC's information rate reduction, compared to Shannon's limit at a certain SNR level, when reliable communication is achieved. In general, carefully designed soft FEC's, compared to hard FEC's, can achieve smaller gaps and lower rate losses to Shannon's limit, at the cost of higher decoding power. FIG. 1 is a graph of attainable information rates as a function of SNR for both hard and FEC technologies. The Figure shows the relationship between various FEC's gaps to Shannon's limit and their rate losses compared to Shannon's limit at various SNR levels. In this Figure, it is assumed that a soft FEC with 1 dB gap to Shannon's limit and a hard FEC with 2 dB gap to Shannon's limit can be designed for every SNR level. From FIG. 1, one can see that in high SNR and low SNR regimes, the rate losses are relatively small even with the same gap to Shannon's limit. This means that when the input BER is very high or very low, there is little information rate advantage by using a high-power-consuming soft FEC decoder.

Practical soft FEC decoders usually consumes more than 10 times, if not 100 times, the power consumed by hard FEC decoders operating at the same signal-to-noise ratio (SNR). Optical transmission systems typically have extremely high throughput, which may be as high as 800 Gb/s per channel. Transmission systems are carefully designed to optimize a trade-off between the per-bit processing power and such very high data rates. Multilevel coding (MLC) was recently introduced in optical systems to achieve a good balance between these objectives.

Figure 2:
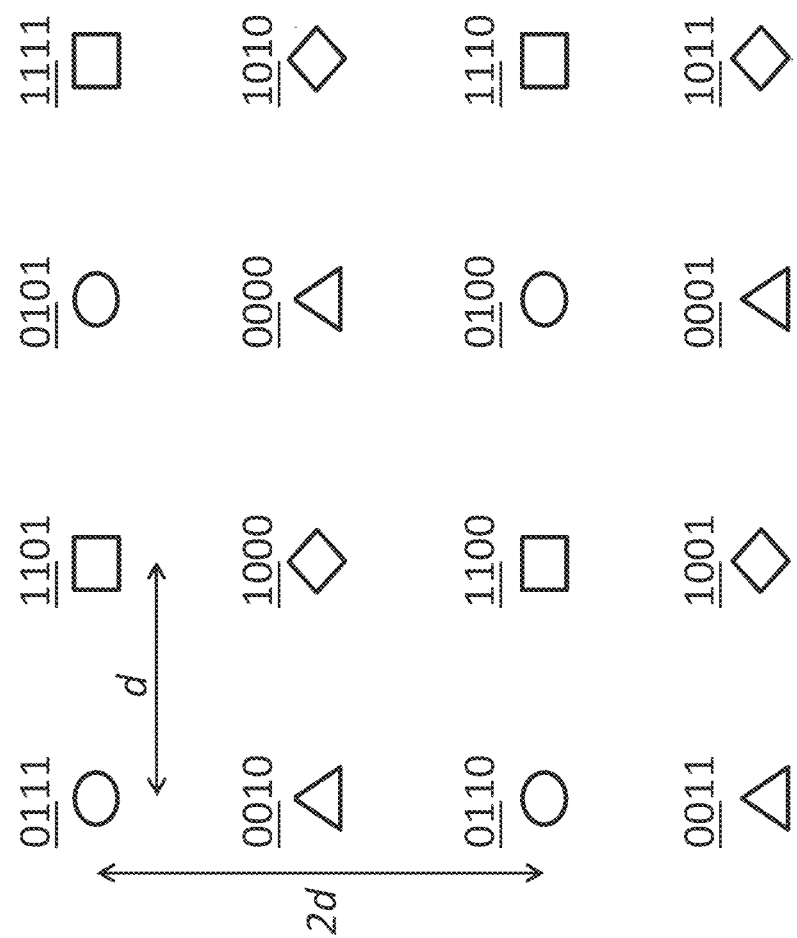
FIG. 2 is an example of a 16 quadrature-amplitude modulation (QAM) constellation labeling scheme used in 2 dimensional (2D) 2-level multilevel coding (MLC)

FIG. 2 is an example of a 16 quadrature-amplitude modulation (QAM) constellation labeling scheme used in 2 dimensional (2D) 2-level multilevel coding (MLC). In the example of FIG. 2, client information bits are first encoded by some FEC scheme for error protection. The resulting bit stream is then divided into groups of 4 bits. Every group of 4 bits is mapped to a constellation point to be transmitted according to the labeling scheme shown in FIG. 2. The 4-bit label of the constellation can be divided into two types of bits: the two most-significant bits (MSBs), which are underlined on FIG. 2, and the two least-significant bits (LSBs). The 2 MSBs of the label partitions the constellation into 4 non-overlapping sub-sets (illustrated using 4 distinct geometric shapes in FIG. 2, a circle corresponding to bits '01' for example). The minimum Euclidean distance 2d of each sub-set is twice the minimum Euclidian distance d of the entire constellation.

For example, the Euclidian distance between constellation points '0111' and '1101' is equal to d, these 2 constellation points having 2 different MSBs respectively equal to '01' and '11'. In contrast, the Euclidian distance between constellation points '0111' and '0110', which share the same 2 MSBs '01', is equal to 2d. Therefore, conditioned on knowing the 2 MSBs of the label, the 2 LSBs exhibit a much lower BER, which is equivalent to a 6 dB SNR gain compared to the entire set of constellation points. In the context of the present disclosure, the expression "conditioned on" is to be understood in the sense that a value may be obtained based on a determination of another value, and does not express that an operation or other feature is optional. Within a reasonable operating SNR range, the BER of the 2 LSBs is usually so low that the rate loss difference between a hard FEC and a soft FEC becomes negligible. Therefore the 2 MSBs in this example can be protected by a soft FEC, while the 2 LSBs in this example can be protected by a hard FEC. By employing MLC, 2 bits per symbol may be decoded by a soft decoder and other bits of the same symbol may be decoded by a hard decoder in order to significantly reduce the decoder power consumption.

In summary, using soft decoder in a first level consisting of 2 MSBs is sufficient to produce 6 dB SNR gain in a second level, such that the second level may satisfactorily be protected by a hard FEC. A low complexity MLC scheme may comprise three levels in the label by jointly designing the MLC over different polarizations and/or different timeslots. This high dimensional MLC design may use 2 different FEC schemes, the number of bits processed by the power-consuming soft FEC decoder being reduced by at least 25% when compared to a complete soft FEC scheme. The present disclosure therefore introduced a High-Dimensional Multilevel-Coded Modulation with Low Decoding Complexity that is expected to bring at least 25% power reduction in the soft FEC decoder module. Some embodiments of the present disclosure provide compatibility with probabilistic constellation shaping (PCS).

The disclosed high-dimensional MLC utilizes more than one symbol in the modulation and demodulation process. These symbols may come from different polarizations or different timeslots. Each of the symbols is selected from the same set of constellation points according to some binary-label mapping. This labeling scheme may be the same or distinct for the jointly modulated symbols, but it consists of three types of bits in which the first two types each consists of 1 bit.

Figure 3:
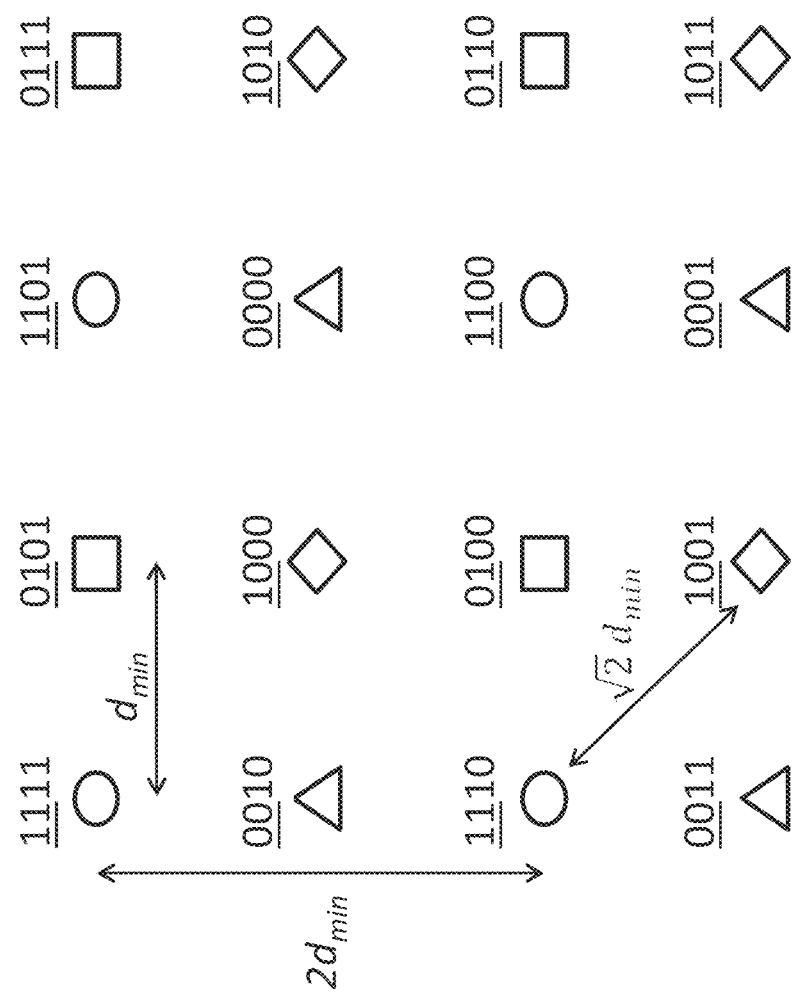
FIG. 3 is an example of a 16 quadrature-amplitude modulation (QAM) constellation labeling scheme used in 4 dimensional (4D) 3-level multilevel coding (MLC) in accordance with an embodiment of the present technology.

Without loss of generality, let all symbols use the same bit labeling scheme, the first type be the $0^{th}$ bit ($b_0$), and the second type be the $1^{st}$ bit ($b_1$). In an M-ary modulation (there are M points in the entire constellation) with a minimum Euclidean distance constellation points with the same $b_0$ form two disjoint subsets with M/2 points in each, and each subset has a minimum Euclidean distance of $d'_{min} > d_{min}$. Constellation points with the same $b_0$ and $b_1$ form four disjoint subsets with M/4 points in each, and each subset has a minimum Euclidean distance of $d''_{min} > d'_{min}$. FIG. 3 is an example of a 16 quadrature-amplitude modulation (QAM) constellation labeling scheme used in 4 dimensional (4D) 3-level multilevel coding (MLC). In the example of FIG. 3, $d'_{min}$ equal to $\sqrt{2} \, d_{min}$ and $d''_{min}$ is equal to $2 \, d_{min}$.

The first (top) level defines 2 subsets, in which one subset is defined by the MSB being equal to 0 (squares and triangles) and the other subset is defined by the MSB being equal to 1 (diamonds and circles). The second level further divides each subset into 2 more subsets, so there are 4 subsets in total. The constellation points are the same as 2D 2-level MLC (squares, triangles, diamonds and circles), but the labelling system is different. Circles have '11' as the 2 MSBs, squares have '01' as the 2 MSBs, and the like. For a third level, once the 2 MSBs (illustrated by the various geometric shapes) is known, there are 4 possible choices for the 2 LSBs. Comparing the constellations of FIGS. 2 and 3, the points illustrated with circles and with squares carry different MSB values while the points illustrated with triangles and diamonds carry the same MSB values.

Two successive symbols to be encoded and the decoded are protected by a repetition code. To this end, the 2 symbols are selected so that they share a same value, '0' or '1', for their MSB. In this manner, the minimum Euclidean distance between the 2 successive symbols is $d'_{min}$, being equal to $\sqrt{2} \, d_{min}$ in the example of FIG. 3 (for example between points '1110' and '1001'. This repetition of the 2 symbols is useful upon decoding of the 2 symbols to minimize errors.

Figure 4A:
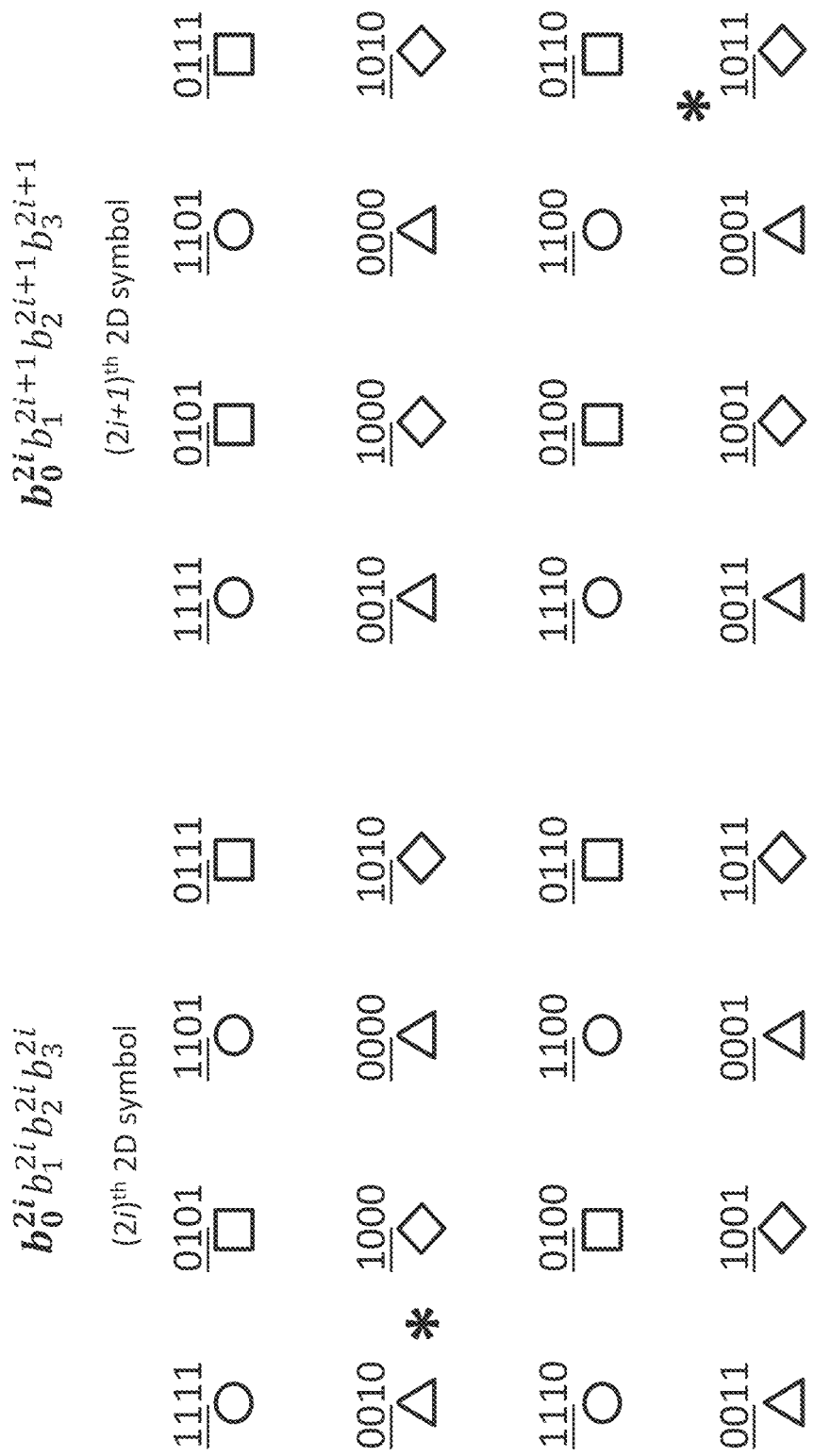
FIGS. 4a-4c illustrate an application of 4D 3-level MLC to decoding of 2 successive symbols in accordance with an embodiment of the present technology.
Figure 4B:
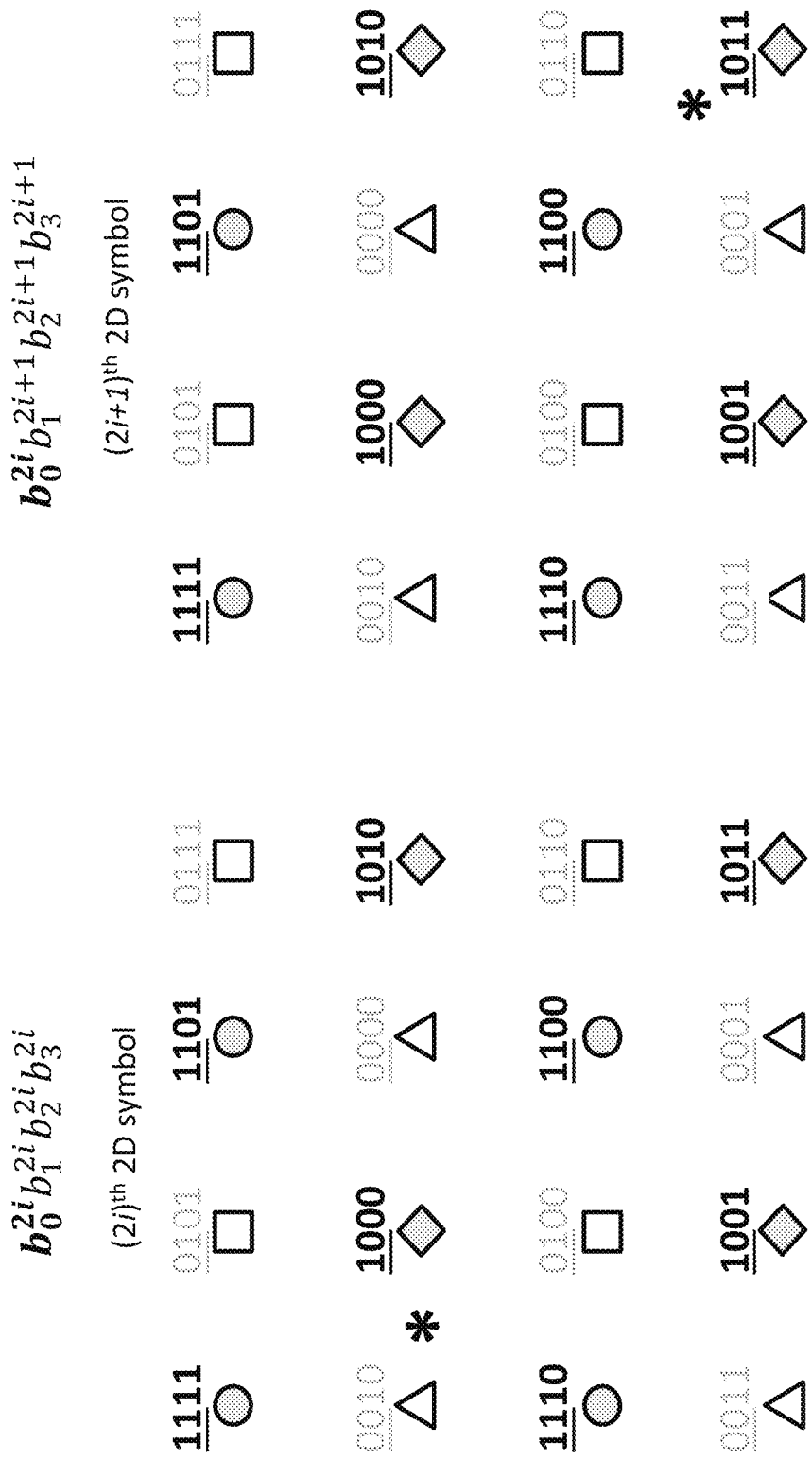
Figure 4C:

FIGS. 4a-4c illustrate an application of 4D 3-level MLC to decoding of 2 successive symbols. In FIG. 4a, two successive symbols (i.e. 2 constellation points) received at the receiver each carry 4 bits, identified as $b_0^{2i} b_1^{2i} b_2^{2i} b_3^{2i}$ and $b_0^{2i+1} b_1^{2i+1} b_2^{2i+1} b_3^{2i+1}$, respectively, for i=0, 1, 2, . . . , where the superscript is the symbol index, while the subscript is the bit index, this notation being applicable to the remainder of the present disclosure. The MSBs of these 2 symbols are protected by a repetition code and a soft FEC. The repetition code has a block length of 2 so that $b_0^{2i} = b_0^{2i+1}$. If for example the MSB is a '1' in the first symbol (the first symbol being illustrated as a circle or a diamond), the second symbol may only be a constellation point also illustrated as a circle or a diamond. Due to noise in the channel, the first symbol is received in the position illustrated with the large '*' symbol on the left hand side of FIG. 4a and the second symbol is received in the position illustration with the large '*' symbol on the right hand side of FIG. 4a. The soft FEC calculates the LLR for the MSB in the first symbol and the LLR for the MSB in the second symbol.

The LLR may have a positive value, indicating that the MSB is most likely to be a '0', or a negative value, indicating that the MSB is most likely to be a '1'. The magnitude of the LLR provides an indication of the confidence of the identification of the MSB. For example on the left hand side of FIG. 4a, the LLR may have a value of +1, indicating that the MSB of the first symbol may be a '0', this indication having a low confidence, this low confidence value being consistent with the fact that the '*' symbol is not particularly close to any of the constellation points—though the various Figures are not to scale, the '*' symbol is slightly closer to point '0010' than to point '1000' on the left hand side of FIG. 4a. On the right hand side of FIG. 4a, the LLR may have a value of −3, indicating that the MSB of the second symbol may be a '1', this indication having a high confidence, this high confidence value being consistent with the fact that the '*' symbol is very close to a constellation point in which the MSB is '1'. Now, the same MSB value being repeated in the 2 successive symbols, there is in the particular example of FIG. 4a a conflict between the successive LLR values that respectively designate a '0' and a '1' as the successive MSB values. This conflict may be overcome by adding the 2 successive LLR values to obtain, in the present case a value of −2 (adding +1 and −3). This negative value indicates that the MSB in the 2 successive symbols is a '1', its magnitude of 2 indicating a reasonable confidence for this indication. Soft decoding of the first and second symbols reveals that their MSBs are probably equal to '1'.

Conditioned on the MSB for these 2 symbols being equal to '1', one half of the constellation points illustrated on FIG. 4a are eliminated from the evaluation of the other bits forming the 2 successive symbols. Turning now to FIG. 4b, all constellation points in which the MSB ($b_0^{2i}$ and $b_1^{2i+1}$) is equal to '1' are highlighted in grey, their values being shown in bold fonts. All constellation points in which the MSB is equal to '0' are dimmed to indicate that they will not be considered in the evaluation of bits $b_1^{2i} b_2^{2i} b_3^{2i}$ and $b_1^{2i+1} b_2^{2i+1} b_3^{2i+1}$ in the 2 symbols. Although 16-QAM modulation is used, there are only 8 remaining constellation points to choose from to identify values of the 2 successive symbols.

Considering now the '*' symbol on the right hand side of FIG. 4b, the 2 most likely values of the symbol considered in isolation are '1011' and '0110'. Without knowing the value of $b_0^{2i+1}$ (which happens to most probably be a '1'), the value of $b_1^{2i+1}$ is likely to be '0' with only a moderate confidence level because the '*' symbol is not too distant from point '0110'. However, once the value of $b_0^{2i+1}$ is known to be a '1', the points '0110' and '0001' are eliminated from the evaluation of $b_1^{2i+1}$, which is now highly likely to be a '0', the second symbol being most likely to be equal to '1011' instead of the more distant point '1100', which is the nearest remaining available point. This determination is facilitated by the fact that points '0001' and '0110' at the Euclidian distance $d_{min}$ from '1011' are eliminated, the point '1100' being at the Euclidian distance $\sqrt{2} \, d_{min}$ from '1011'. Decoding error probabilities for the second MSB of the 2 successive symbols ($b_1^{2i}$ and $b_1^{2i+1}$) are reduced because of the increased Euclidian distance between available constellation points for their decoding.

In the present example, the soft FEC decoder may determine that the second MSB ($b_1^{2i}$) for the first symbol is equal to '1' and that the second MSB ($b_1^{2i+1}$) for the second symbol is equal to '0'. To this end, soft FEC decoding is fully applied to the second MSB of each symbol. Turning to FIG. 4c, given that the 2 MSBs ($b_0^{2i} b_1^{2i}$) for the first symbol on the left hand side have been decoded as '11', there are only 4 remaining choices for the values of the 2 LSBs ($b_2^{2i} b_3^{2i}$). On the left hand side, all constellation points in which the 2 MSBs are not equal to '11' are dimmed to indicate that they will not be considered in the evaluation of $b_2^{2i} b_3^{2i}$ in the first symbol. Likewise, given that the 2 MSBs ($b_0^{2i+1} b_1^{2i+1}$) for the second symbol on the right hand side have been decoded as '10', there are only 4 remaining choices for the values of the 2 LSBs ($b_2^{2i+1} b_3^{2i+1}$). All constellation in which the 2 MSBs are not equal to '10' are dimmed to indicate that they will not be considered in the evaluation of $b_2^{2i+1} b_3^{2i+1}$ in the second symbol. The minimum Euclidian distance between each of these choices is increased further and a much lower BER is expected for these LSBs. A hard FEC may be used to encode and decode these bits. Although hard FEC is used, the Euclidian distance between the 4 points on each side of FIG. 4c still applies. As such, the 2 LSBs for the first symbol is likely to be equal to '10' (the '*' symbol being closest to point '1110') and the 2 LSBs for the second symbol is highly likely to be equal to '11' (the '*' symbol being closest to point '1011'). It may be noted that the hard FEC considers the sign of the LLR calculation to determine the values of the 2 LSBs. The hard FEC does not consider the magnitude of the LLR in order to save computation power.

Soft FEC is applied to 2 MSBs per symbol. However, computation power is further reduced by the fact that the LLRs calculated for the MSB of the 2 successive symbols are added, effectively reducing 2 LLRs to one single LLR for the MSB of the 2 symbols. The soft FEC therefore only processes 1.5 bits per symbol, resulting in a 25% power reduction when compared to applying soft FEC independently on the 2 MSBs of each symbol.

The above illustration of 4D 3-level MLC in FIGS. 4a-4c may be generalized in mathematical form. In a case where K symbols are jointly modulated, let $b^j$ be the label of the $j^{th}$ symbol, and $b_i^j$ be the $i^{th}$ bit in the label of the $j^{th}$ symbol. The bits $b_0^0, b_0^1, \ldots, b_0^K$ are correlated to each other, such that they form a codeword of some simple short block code, C (e.g., a repetition code or a single parity check (SPC) code, or a combination of the two). The constraints imposed by C can be used to correct errors in $b_0$'s, while it is short and simple enough to be decoded in the demodulation module. With reduced BER, $b_0^k$ and $b_1^l$, $k \neq l$ and $b_0^k$ and $b_0^l$ do not belong to the same code block in C, can be mixed together to form a soft FEC codeword, and decoded by a single soft FEC decoder. Conditioned on the decoded $b_0$ and $b_1$, the remaining bits exhibit a BER that is sufficiently low to be decoded by a hard FEC. Parity bits in C do not need to be processed by the soft FEC decoder.

The following detailed 16-QAM examples illustrate how the block code C can be decoded with negligible complexity compared to the soft FEC decoder. In an embodiment, 16-QAM constellation with the bit-labels described in FIG. 3 are used. Two complex symbols (4 real dimensions), S(p) and S(q) (the $p^{th}$ and $q^{th}$ symbols respectively), are modulated together in the coded modulation. In general, these two symbols may be from two polarizations or two timeslots, and may or may not be adjacent. Without loss of generality, in this example, let S(p)=S(2i) and S(q)=S(2i+1) be two symbols at time 2i and 2i+1. Let the label for the $j^{th}$ symbol be $b^j = b_0^j b_1^j b_2^j b_3^j$. The code C used in this example is a repetition code of length 2, such that $b_0^{2i} = b_0^{2i+1}$. This means that with two 16-QAM symbols, at most 7 bits of information can be transmitted through the channel, and once S(2i) is fixed, S(2i+1) may only be selected from 8 constellation points. In more details, if $0 \leq b^{2i} < 8$, then $0 \leq b^{2i+1} < 8$; and if $8 \leq b^{2i} < 16$, then $8 \leq b^{2i+1} < 16$.

The example of FIGS. 4a-4c describe a particular embodiment when 2 symbols that share the same value for $b_0^{2i}$ and $b_0^{2i+1}$ are successive symbols, being for example transmitted over 2 successive timeslots. The present technology may be generalized so that 2 symbols may be associated without being successive. In one non-limiting example, 2 associated symbols may consist of successive even-numbered symbols and 2 other associated symbols may consist of successive odd-numbered symbols. In another non-limiting example, 2 associated symbols may comprise one symbol having a first polarization and another symbol having another polarization. Any 2 symbols may be associated and share the same value for $b_0^{2i}$ and $b_0^{2i+1}$ as long as the manner in which these symbols are associated is known by both the encoding and decoding sides.

Figure 5A:
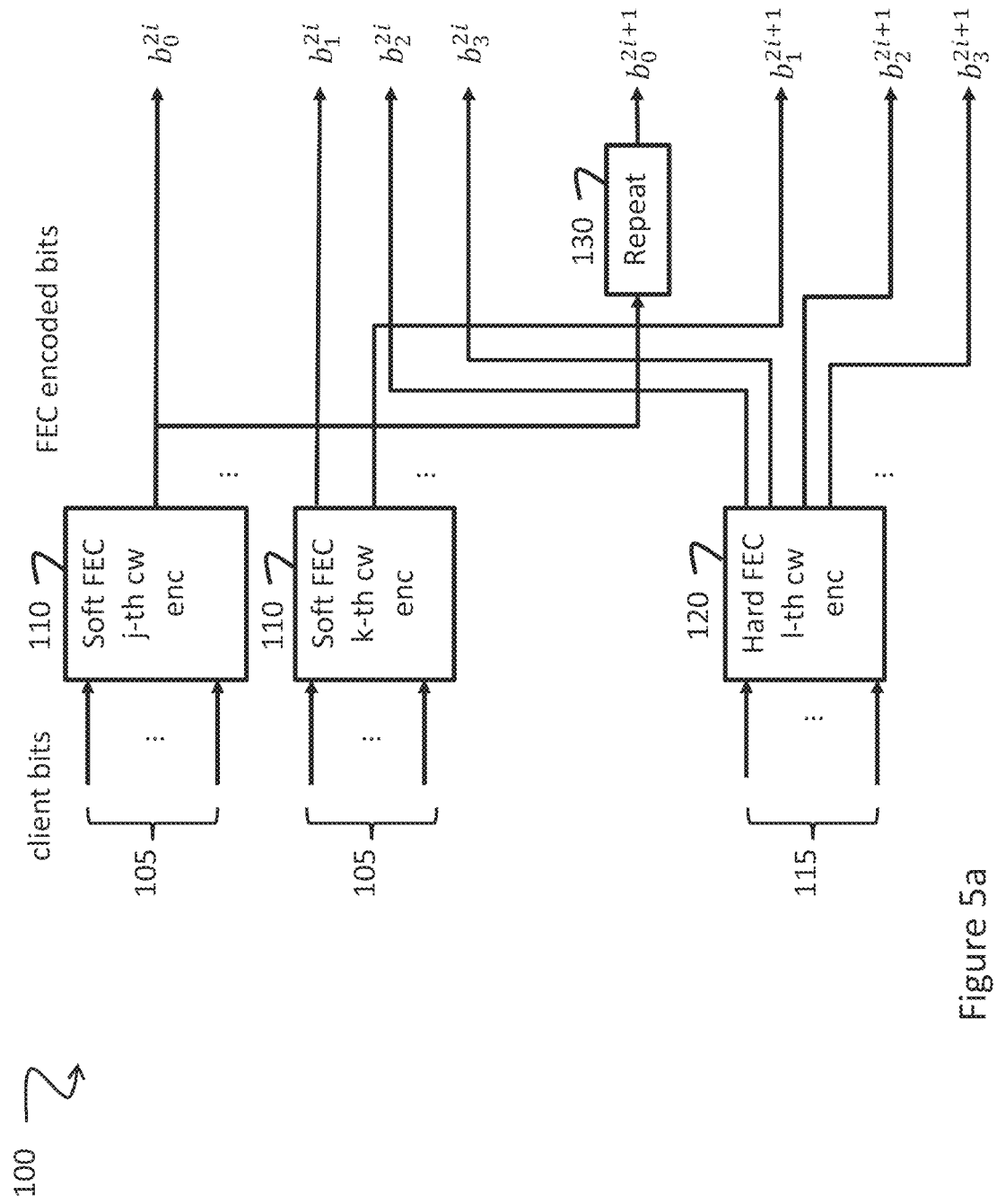
FIG. 5a is a block diagram of a 4D 3-level MLC encoder with a repetition code of length 2 in accordance with an embodiment of the present technology.

FIG. 5a is a block diagram of a 4D 3-level MLC encoder 100 with a repetition code of length 2. This Figure describes how the 4D 3-level MLC encoder works on a transmitter side. Some client bits 105 are encoded by a soft FEC encoder 110 that generates bits $b_0^{2i}, b_1^{2i}, b_1^{2i+1}$. Some client bits 115 are encoded by a hard FEC encoder 120 that generates $b_2^{2i}, b_3^{2i}, b_2^{2i+1}, b_3^{2i+1}$. A redundancy generator, for example a repeater 130, generates a redundant bit, for example $b_0^{2i+1}$, which is equal to $b_0^{2i}$. The soft FEC encoder 110 is illustrated twice on FIG. 5a in order to illustrate the generation of $j^{th}$ and $k^{th}$ codewords. In one embodiment of the encoder 100, $b_0^{2i}, b_0^{2i+1}, b_1^{2i}, b_1^{2i+1}$ may be MSBs of labels mapping on constellation points and $b_2^{2i}, b_3^{2i}, b_2^{2i+1}, b_3^{2i+1}$ may be LSBs of the labels. In another embodiment of the encoder 100, $b_0^{2i}, b_0^{2i+1}, b_1^{2i}, b_1^{2i+1}$ may be LSBs of labels mapping on constellation points and $b_2^{2i}, b_3^{3i}, b_2^{2i+1}, b_3^{2i+1}$ may be MSBs of the labels. In a non-limiting example, bits $b_0^{2i}, b_0^{2i+1}, b_1^{2i}, b_1^{2i+1}$ may be found in first bit locations of the labels, being MSBs or LSBs, while bits and $b_2^{2i}, b_3^{2i}, b_2^{2i+1}, b_3^{2i+1}$ may be found in second bit locations of the labels, in contrast being LSBs or MSBs. In another non-limiting example, bits $b_0^{2i}, b_0^{2i+1}, b_3^{2i}, b_3^{2i+1}$ may be found in first bit locations of the labels and bits $b_1^{2i}, b_2^{2i}, b_1^{2i+1}, b_2^{2i+1}$ may be found in second bit locations of the labels. Bits in the first bit locations may be adjacent or not, and bits in the second bit locations may be adjacent or not.

Hence, the soft FEC encoder 110 produces 3 bits every 2 complex symbols ($b_0^{2i}, b_1^{2i}, b_1^{2i+1}$), among which $b_0^{2i}$ is part of a different codeword (cw) compared to $b_1^{2i}$ and $b_1^{2i+1}$. The bit $b_0^{2i}$ is repeated by the repeater 130 to produce $b_0^{2i+1} = b_0^{2i}$, so that one third of the set of bits $b_0^{2i}, b_1^{2i}, b_1^{2i+1}$ is generated by the repeater 130. The hard FEC encoder 120 produces 4 bits every 2 complex symbols ($b_2^{2i}, b_3^{2i}, b_2^{2i+1}, b_3^{2i+1}$). The binary labels $b^{2i} = b_0^{2i} b_1^{2i} b_2^{2i} b_3^{2i}$ and $b^{2i+1} = b_0^{2i+1} b_1^{2i+1} b_2^{2i+1} b_3^{2i+1}$ are mapped to constellation points S(2i) and S(2i+1), respectively, using the mapping described in FIG. 3.

Figure 5B:
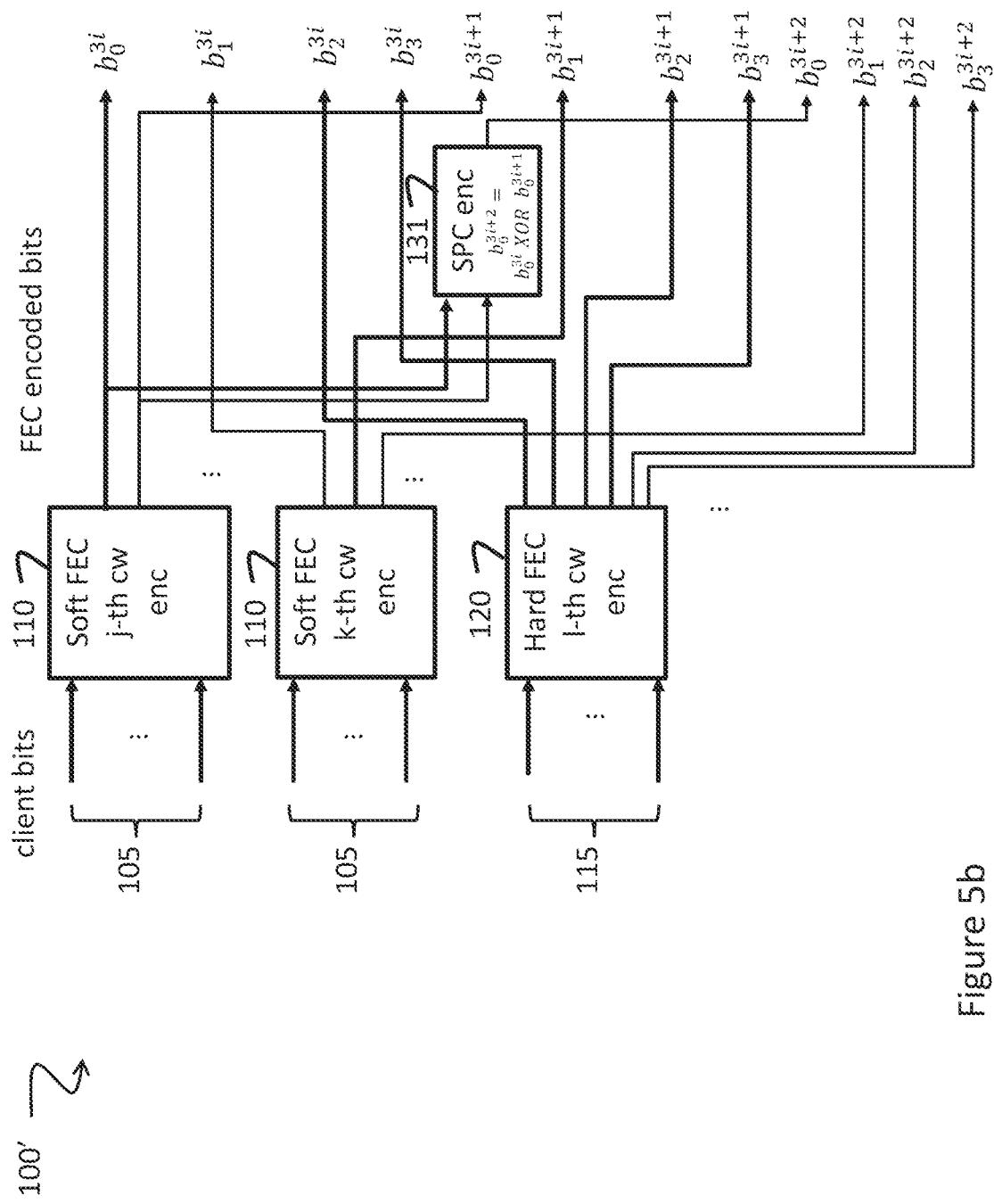
FIG. 5b is a block diagram of a 4D 3-level MLC encoder with a single parity check code of length 3 in accordance with an embodiment of the present technology.

FIG. 5b is a block diagram of a 4D 3-level MLC encoder with a single parity check code of length 3. An encoder 100' differs from the encoder 100 of FIG. 5a in that:
  a. The soft FEC encoder 110 generates bits in a first bit location for two labels (e.g. $b_0^{3i}$ and $b_0^{3i+1}$), instead of for one label as in the case of FIG. 5a;
  b. The repeater 130 is replaced by another redundancy generator, for example a single parity check (SPC) encoder 131, which receives the above mentioned 2 bits from the soft FEC encoder 110 and applies an exclusive OR (XOR) function of these bits to generate a redundant bit in the same bit location for a third label (e.g. $b_0^{3i+2} = b_0^{3i}$ XOR $b_0^{3i+1}$);

c. The soft FEC encoder 110 generates a bit in a second bit location for the third label (e.g. $b_1^{3i+2}$), in addition to the second bit location bits generated by the soft FEC encoder 110 in the case of FIG. 5*a*; and d. The hard FEC encoder 120 additionally generates bits in the third and fourth bit locations (e.g. $b_2^{3i+2}$, $b_3^{3i+2}$) to complete the third label.

Figure 5C:
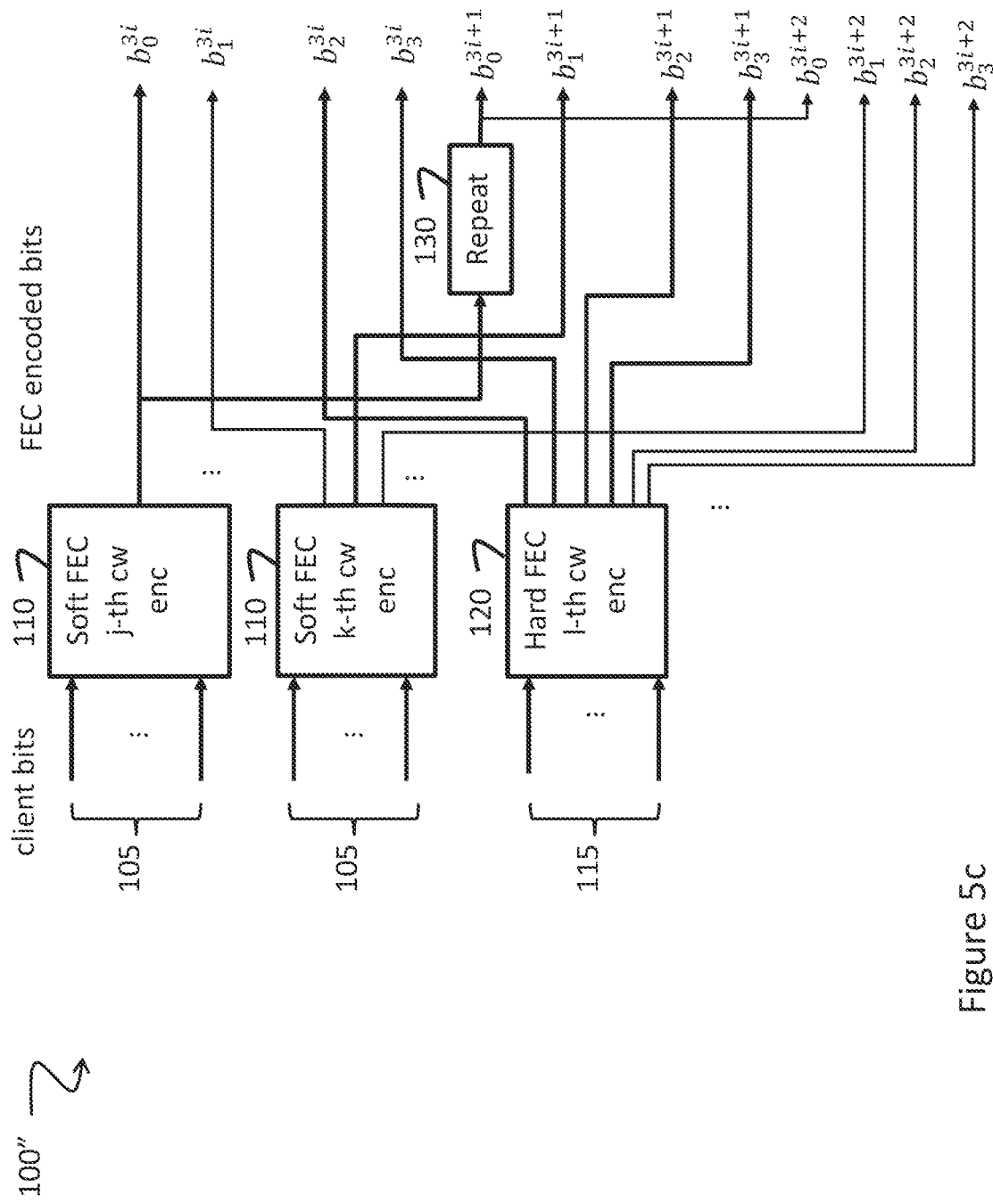
FIG. 5c is a block diagram of a 4D 3-level MLC encoder with a repetition code of length 3 in accordance with an embodiment of the present technology.

FIG. 5*c* is a block diagram of a 4D 3-level MLC encoder with a repetition code of length 3. An encoder 100" differs from the encoder 100 of FIG. 5*a* in that:

a. The repeater 130 generates two redundant bits, which are both copies of the bit generated by the soft FEC encoder 110 for the first bit location (e.g. $b_0^{3i}$), so that the same bit is found in the first bit location for three labels (e.g. $b_0^{3i}$, $b_0^{3i+1}$, $b_0^{3i+2}$);

b. The soft FEC encoder 110 generates a bit in a second bit location for the third label $b^{3i+2}$, as in the case of FIG. 5*b*; and c. The hard FEC encoder 120 additionally generates bits in the third and fourth bit locations (e.g. $b_2^{3i+2}$, $b_3^{3i+2}$) to complete the third label, as in the case of FIG. 5*b*.

Figure 6A:
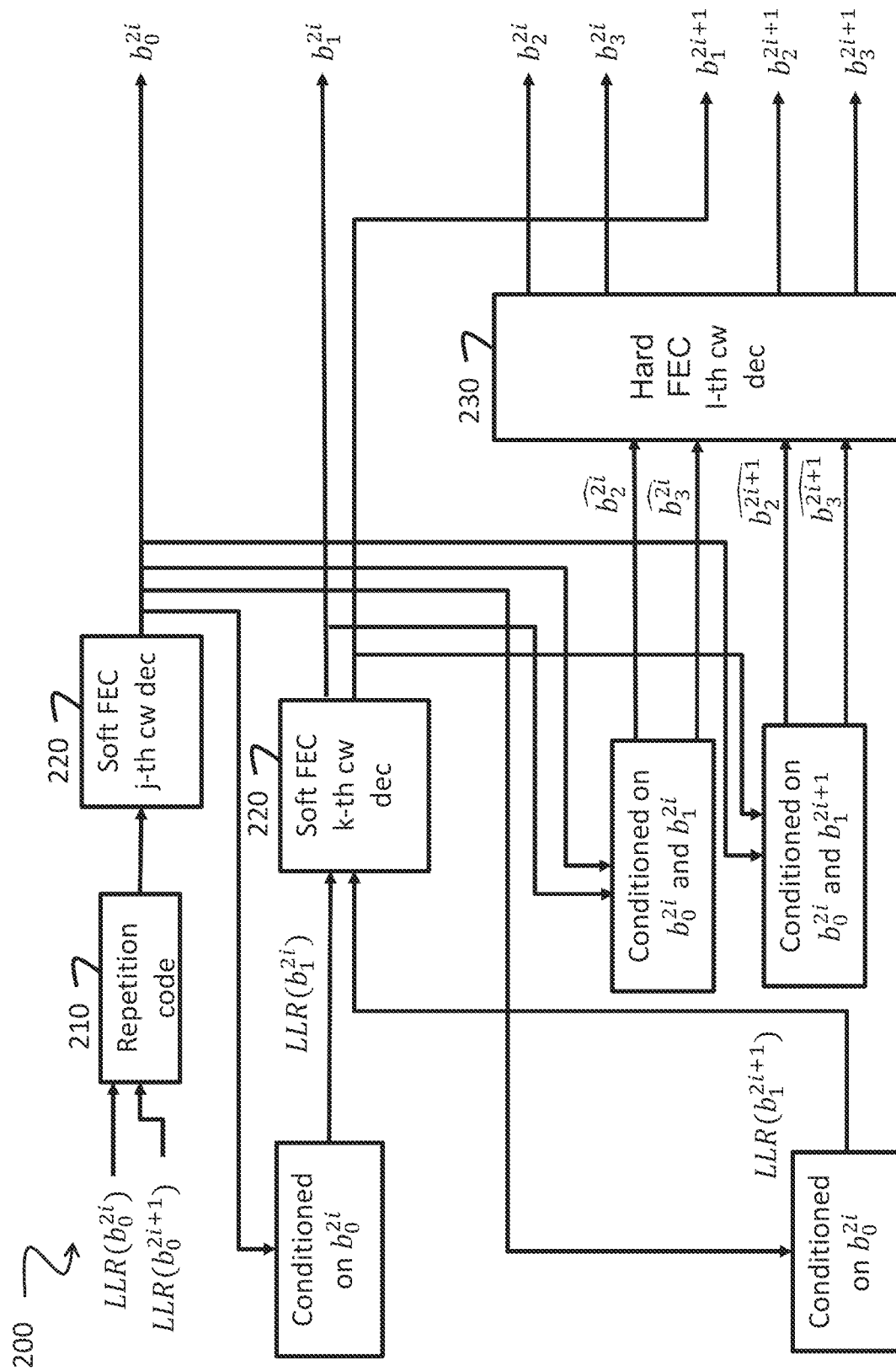
FIG. 6a is a block diagram of a 4D 3-level MLC decoder with a repetition code of length 2 in accordance with an embodiment of the present technology.

FIG. 6*a* is a block diagram of a 4D 3-level MLC decoder 120 with a repetition code of length 2. Some entities illustrated in FIG. 6*a* are functional modules while some others are added in order to represent impacts (conditions) of some bit-value determinations on the determination of other bit-values. A demodulator (FIG. 12) of a received bit stream produces LLR of $b_0^{2i}$ and $b_0^{2i+1}$. Since $b_0^{2i+1}$ is equal to $b_0^{2i}$ by design, an improved LLR of $b_0^{2i}$ may be calculated by a redundancy decoder, for example repetition code module 210 calculating the improved LLR as LLR'($b_0^{2i}$)=LLR($b_0^{2i}$)+LLR($b_0^{2i+1}$). It may be noted that $b_0^{2i+1}$ is not shown on the right hand side of FIG. 6*a* because $b_0^{2i+1}$ is a parity bit that does not bear any client information that is not already known in $b_0^{2i}$. LLR'($b_0^{2i}$) along with the LLR values from other symbols are passed to a soft FEC decoder 220 to produce an estimate on $b_0^{2i}$, where this estimate is equal $b_0^{2i}$ with BER of less than $10^{-15}$ (the estimate is denoted as $\hat{b}_0^{2i}$, given the extremely low BER). Considering $d_{min}$ as the minimum Euclidean distance of the 16-QAM constellation, conditioned on knowing $b_0^{2i}$ and $b_0^{2i+1}$, having the same value, half of the constellation points are eliminated. The minimum Euclidean distance among the remaining possible constellation points is $\sqrt{2}\, d_{min}$. The demodulator calculates LLR($b_1^{2i}$) and LLR($b_1^{2i+1}$), which are passed into the soft FEC decoder 220 to determine $b_1^{2i}$ and $b_1^{2i+1}$. Conditioned on knowing $b_0^{2i}$, $b_1^{2i}$, $b_0^{2i+1}$ (which is a copy of $b_0^{2i}$), and $b_1^{2i+1}$, the demodulator computes hard estimates $\widehat{b_2^{2i}}$, $\widehat{b_3^{2i}}$, $\widehat{b_2^{2i+1}}$, and $\widehat{b_3^{2i+1}}$, which are decoded by a hard FEC decoder 230 to determine $b_2^{2i}$, $b_3^{2i}$, $b_2^{2i+1}$, and $b_3^{2i+1}$. The client bits 115 (FIG. 5*a*) have been decoded with an error probability lower than $10^{-15}$. The 2 complex symbols comprise a total of 8 bits in their labels. However, 3 bits are decoded by the soft FEC decoder 220 and 4 bits are decoded by the hard FEC decoder. This leads to 25% throughput and power reduction on the soft FEC decoder compared to conventional solutions. As such, in the embodiment of FIGS. 5 and 6, the 4D 3-level MLC is capable of reducing the soft FEC decoder power by 25%. Although there are 3 levels in the MLC, only two FEC schemes are needed in the encoder/decoder modules. The repetition code has negligible complexity compared to the soft FEC scheme, and may easily be implemented in modulator/demodulator modules. As in the case of the encoder 100 of FIG. 5*a*, in one embodiment of the decoder 200, $b_0^{2i}$, $b_0^{2i+1}$, $b_1^{2i}$, $b_1^{2i+1}$ may be MSBs of labels mapping on constellation points and $b_2^{2i}$, $b_3^{2i}$, $b_2^{2i+1}$, $b_3^{2i+1}$ may be LSBs of the labels. In another embodiment of the decoder 200, $b_0^{2i}$, $b_0^{2i+1}$, $b_1^{2i}$, $b_1^{2i+1}$ may be LSBs of labels mapping on constellation points and $b_2^{2i}$, $b_3^{2i}$, $b_2^{2i+1}$, $b_3^{2i+1}$ may be MSBs of the labels.

Figure 6B:
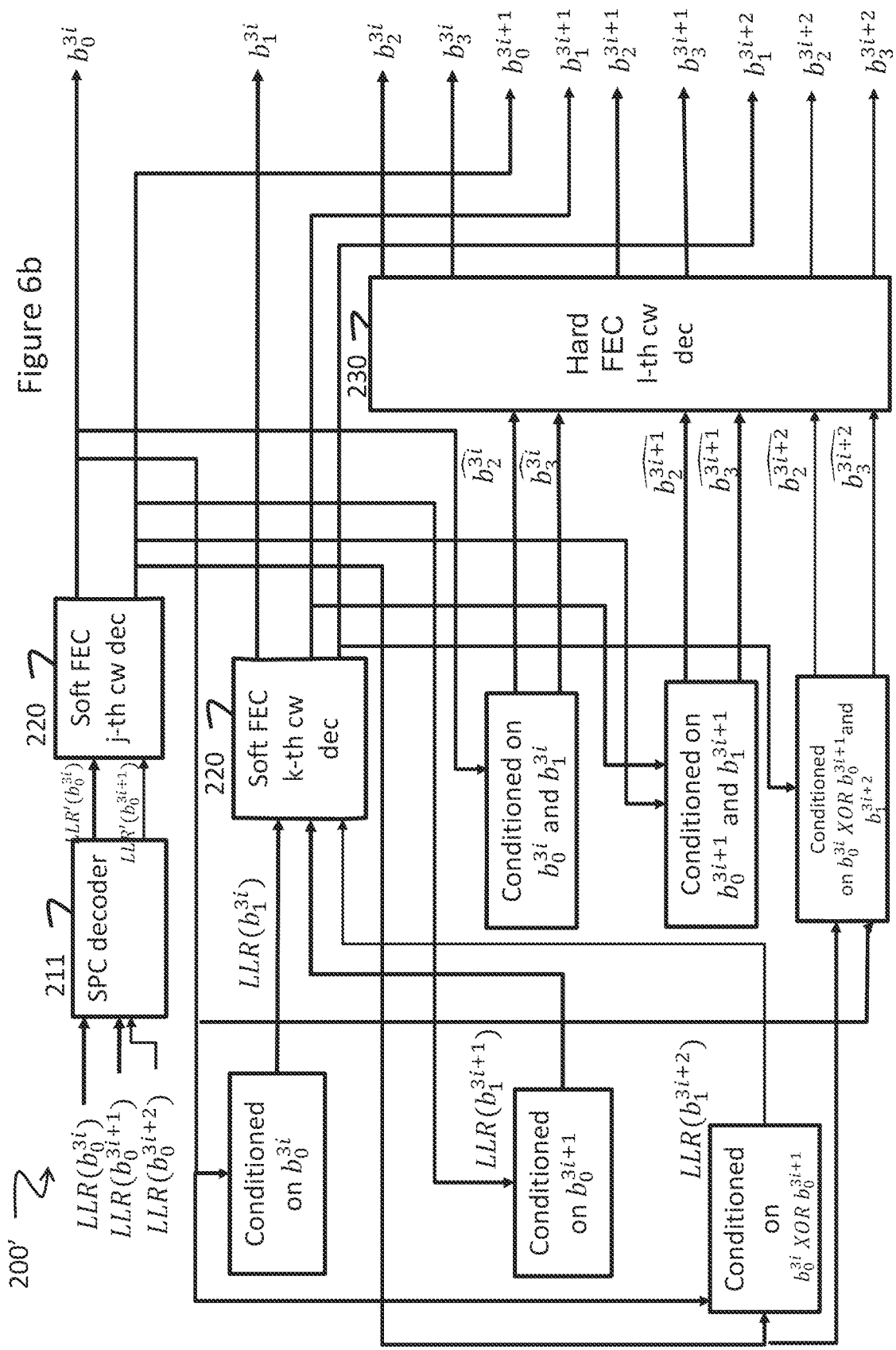
FIG. 6b is a block diagram of a 4D 3-level MLC decoder with a single parity check code of length 3 in accordance with an embodiment of the present technology.

FIG. 6*b* is a block diagram of a 4D 3-level MLC decoder with a single parity check code of length 3. A decoder 200' differs from the decoder 200 of FIG. 6*a* in that:

a. The repetition code module 210 is replaced by another type of redundancy decoder, which is a SPC decoder 211 that receives LLRs of bits in a first bit location of first, second and third labels (e.g. $b_0^{3i}$, $b_3^{3i+1}$, $b_0^{3i+2}$) and calculates improved LLRs for the bits in the first bit location for the first and second labels (e.g. $b_0^{3i}$, $b_0^{3i+1}$), allowing the FEC decoder 220 to generate the bits in the first bit location for the first and second labels;

b. The bit in the first bit location of the third label (e.g. $b_0^{3i+2}$) does not carry any client information;

c. Generation by the soft FEC decoder 220 of the bit in a second bit location for the label (e.g. $b_1^{3i+1}$) is conditioned on the bit in the first bit location for the second label (e.g. $b_0^{3i+1}$);

d. The soft FEC decoder 220 additionally generates a bit in the second bit location for the third label (e.g. $b_1^{3i+2}$), this generation being conditioned on an exclusive OR function of the bits in the first bit location for the first and second labels (e.g. $b_0^{3i}$ XOR $b_0^{3i+1}$);

e. Generation by the hard FEC decoder 230 of bits in third and fourth bit locations for the second label (e.g. $b_2^{3i+1}$ $b_3^{3i+1}$) is as described in relation to FIG. 6*a*, with the exception that this generation is conditioned in part on the bit in the first location of the second label (e.g. $b_0^{3i+1}$), which is distinct from the bit in the first location for the first label (e.g. $b_0^{3i}$); and f. The hard FEC decoder 230 generates bits in third and fourth bit locations for the third label (e.g. $b_2^{3i+2}$ $b_3^{3i+2}$), this generation being conditioned on a bit in the second bit location for the third label (e.g. $b_1^{3i+2}$) and on an exclusive OR function of the bits in the first bit location for the first and second labels (e.g. $b_0^{3i}$ XOR $b_1^{3i+1}$).

Figure 6C:
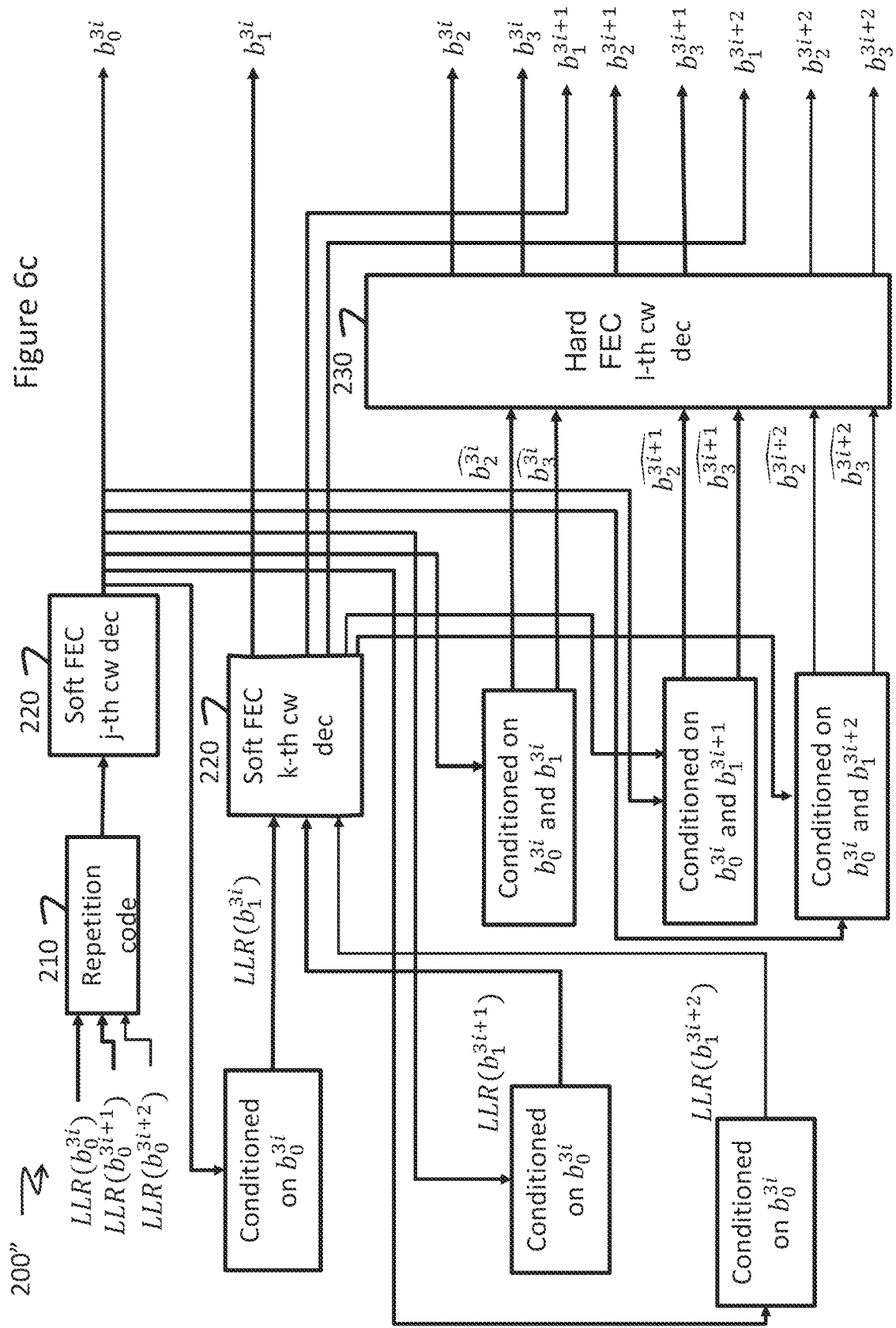
FIG. 6c is a block diagram of a 4D 3-level MLC decoder with a repetition code of length 3 in accordance with an embodiment of the present technology.

FIG. 6*c* is a block diagram of a 4D 3-level MLC decoder with a repetition code of length 3. A decoder 200" differs from the decoder 200 of FIG. 6*a* in that:

a. The LLR of a bit in a first bit location of a third label is additionally input in the repetition code module 210, the repetition code module 210 calculating an improved LLR to allow the soft FEC decoder 220 to generate the bit in the first bit location of the first label (e.g. $b_0^{3i}$);

b. Copies of the bit in the first bit location of the first label (e.g. $b_0^{3i}$), which carries client information, are placed in the same first bit location in second and third labels (e.g. $b_0^{3i+1}$ and $b_0^{3i+2}$). These copies do not carry any additional client information;

c. The soft FEC decoder 220 additionally generates a bit in a second bit location of the third label (e.g. $b_1^{3i+2}$), this generation being made conditioned on the bit in the first bit location of the first label (e.g. $b_0^{3i}$, which is the same as $b_0^{3i+1}$ and $b_0^{3i+2}$); and d. The hard FEC decoder 230 additionally generates bits in the third and fourth bit locations for the third label, this generation being conditioned on the bit in the first bit location for the first label (e.g. $b_0^{3i}$) and on the bit in the second bit location for the third label (e.g. $b_1^{3i+2}$).

Figure 7:
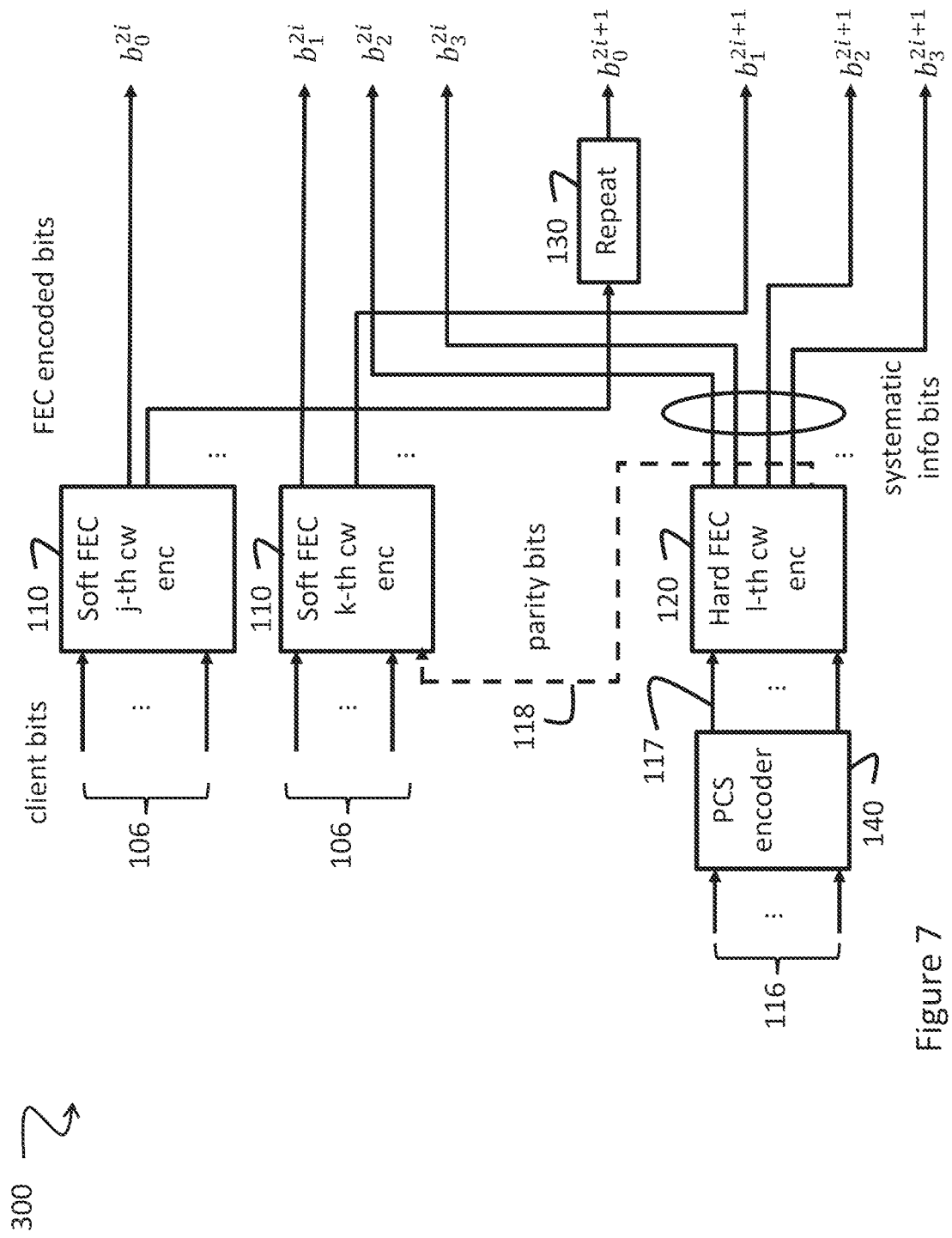
FIG. 7 is a block diagram of a 4D 3-level MLC encoder with probabilistic constellation shaping (PCS) in accordance with an embodiment of the present technology.

Probabilistic constellation shaping (PCS) has been widely used in optical communication to achieve adaptive client data rate, and to improve the noise tolerance of the system at a given client data rate. When PCS is employed, constellation points with greater magnitude are typically transmitted with lower probabilities. This also means that different constellation labels appear with different probability. Embodiments of the present technology may be adapted for compatibility with PCS. For example, FIG. 7 is a block diagram of a 4D 3-level MLC encoder 300 with PCS. The encoder 300 includes the same or equivalent components as introduced in the description of the encoder 100 (FIG. 5a), so the present description will mainly focus on additional components. Clients bits 106 (which may or may not be the same as the client bits 105 of FIG. 5a) are applied to the soft FEC encoder 110. Client bits 116 (which may or may not be the same as the client bits 115 of FIG. 5a) are applied to a PCS encoder 140. The client bits 106 have an equal probability of being '0' or '1'. The client bits 106 have a higher bit error probability and are thus encoded by the soft FEC encoder 110.

In the embodiment of FIG. 7, the PCS encoder 140 takes in a m bit sequence of the client bits 116 and outputs an n bit sequence (n>m) of bits 117. Among the client bits 116, each bit has the same probability of being '0' or '1'. In contrast, the bits 117 at the output of the PCS encoder 140 have an unequal probability of being '0' or '1', '0' being favored in the present labeling scheme example.

The PCS encoder 140 is not systematic in general, so the client bits 116 are not directly represented in the bits 117. The bits 117 at the output of the PCS encoder 140 are applied to the hard FEC encoder 120 that produces systematic information bits such as $b_2^{2i}$, $b_3^{2i}$, $b_2^{2i+1}$, $b_{32}^{2i+1}$ and the like. The hard FEC encoder 120 also generates parity bits 118 that have equal probabilities of being '0' or '1' and are applied to the soft FEC encoder 110, which takes a mixture of the client bits 106 and of the parity bits 118 to generate the output bits such as $b_0^{2i}$, $b_{21}^{2i}$, $b_1^{2i+1}$, and the like. The repeater 130 produces $b_0^{2i+1}=b_0^{2i}$ as in the case of FIG. 5a.

When the labeling scheme introduced in FIG. 3 is used, let p(b) be the probability of a constellation point labelled as b being transmitted. PCS usually assigns the probabilities such that p(0000)>p(0010)>p(0011). It is worth noting that in both the 2D 2-level MLC (FIG. 2) and the 4D 3-level MLC (FIG. 3), the magnitude of a constellation point may be determined solely by the two LSBs ($b_2 b_3$). When PCS is used, each of the two LSBs have a higher probability of being equal to '0' than '1'. A systematic hard FEC encoder 120 is used so that the information bits are preserved as part of encoded bits, to preserve the non-equal probabilities of '0's and '1's. However, parity bits from the hard FEC encoder 120 have an equal probability of being equal to '0' and to '1'. Therefore, the parity bits of the hard FEC encoder 120 are put in the two MSBs and protected by the soft FEC encoder 110 as well, thus becoming part of the soft FEC information bits. With this modification, the 4D 3-level MLC encoder 300 becomes compatible with PCS.

Figure 8:
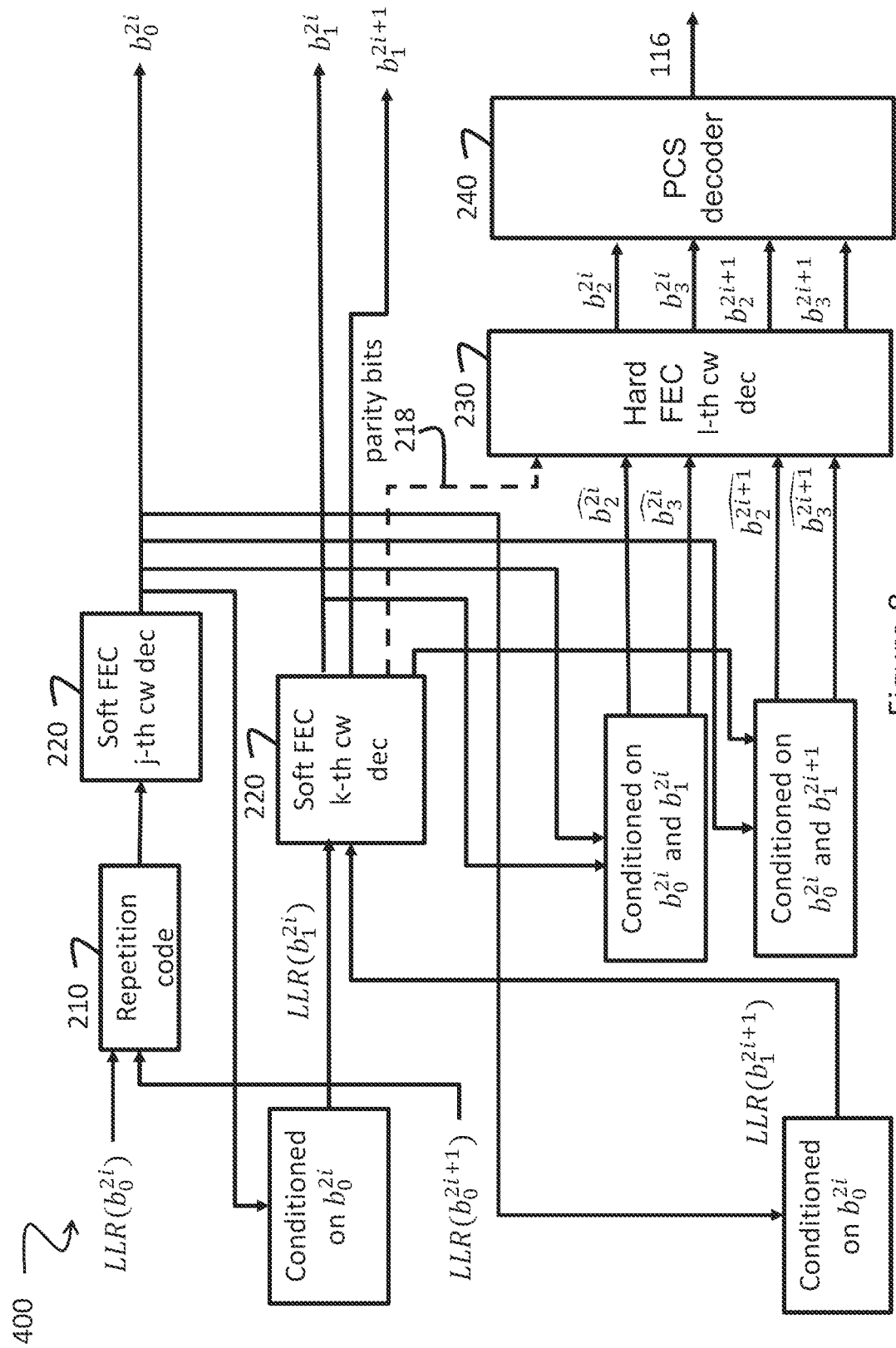
FIG. 8 is a block diagram of a 4D 3-level MLC decoder with PCS in accordance with an embodiment of the present technology.

FIG. 8 is a block diagram of a 4D 3-level MLC decoder with PCS. The decoder 400 includes the same or equivalent components as introduced in the description of the decoder 200 (FIG. 6a). One distinction is that the soft FEC decoder 220 produces hard FEC parity bits 218 that are applied to the hard FEC decoder 230 for determining $b_2^{2i}$, $b_3^{2i}$, $b_2^{2i+1}$, and $b_3^{2i+1}$. The hard FEC parity bits 218 at the output of the soft FEC decoder 220 have a BER lower than $10^{-15}$. The hard FEC parity bits 218 come from the MSBs of some symbols, but are not part of the client bits 106. The hard FEC decoder 230 utilizes the (almost error-free) hard FEC parity bits 218 to correct errors in $\widehat{b_2^{2i}}$, $\widehat{b_3^{2i}}$, $\widehat{b_2^{2i+1}}$,, and $\widehat{b_3^{2i+1}}$, $b_2^{2i}$, $b_3^{2i}$, $b_2^{2i+1}$, and $b_3^{2i+1}$ are then processed by a PCS decoder 240 to recover the client bits 116.

Figure 9:
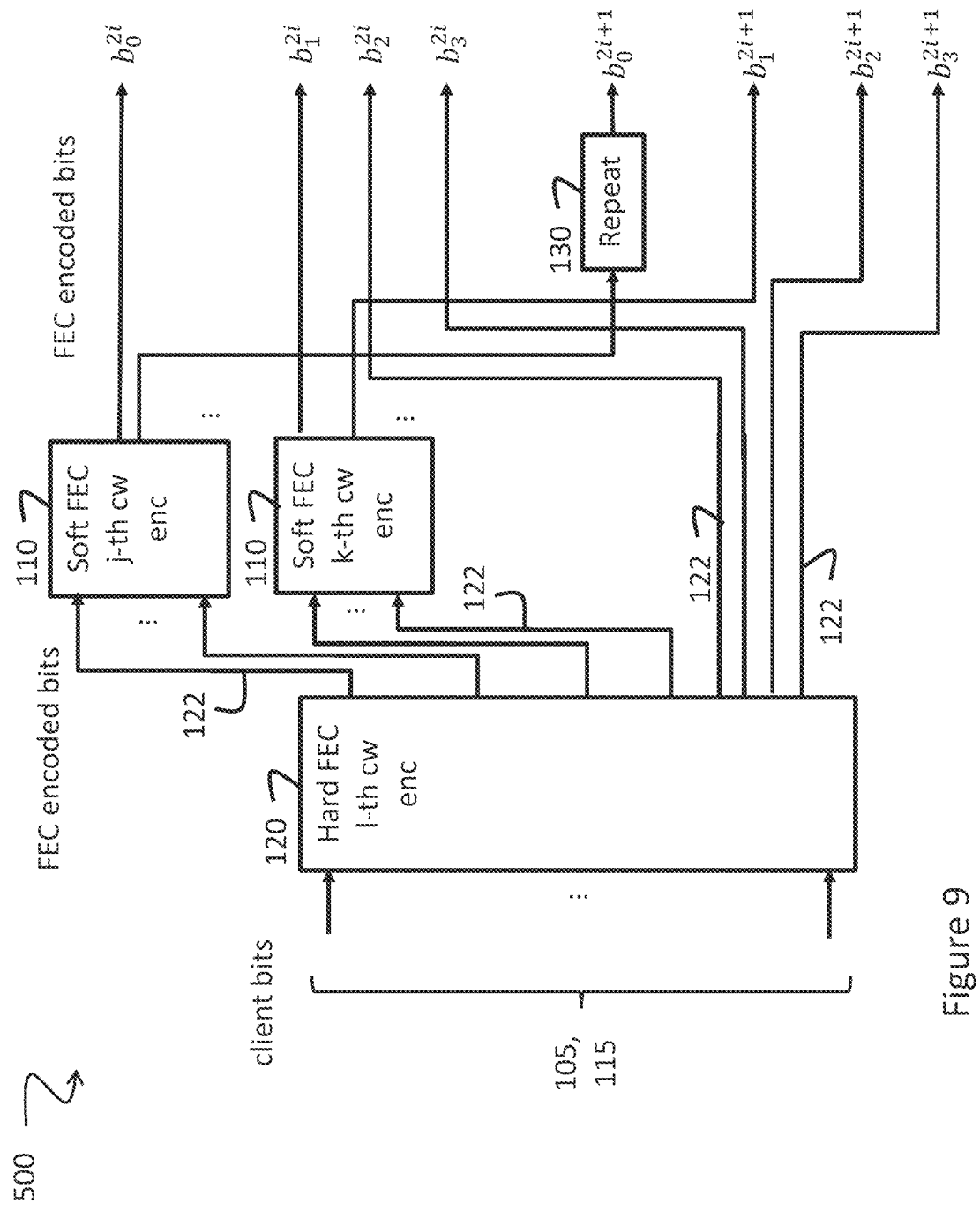
FIG. 9 is a block diagram of a 4D 3-level MLC encoder with concatenated FEC in accordance with an embodiment of the present technology.

The disclosed 4D 3-level MLC scheme may also be modified to be compatible with a concatenated FEC design. FIG. 9 is a block diagram of a 4D 3-level MLC encoder 500 with concatenated FEC. The encoder 500 includes the same or equivalent components as introduced in the description of the encoder 100 (FIG. 5a), so the present description will mainly focus on differences between these encoders. All client bits 105 and 115 are first encoded by the hard FEC encoder 120 that produced FEC encoded bits 122. Some of the hard FEC encoded bits 122 are MSBs, which are then encoded by the soft FEC encoder 110 to produce bits corresponding to $b_0^{2i}$, $b_1^{2i}$ and $b_1^{2i+1}$. Other hard FEC encoded bits 122 are LSBs corresponding to $b_2^{2i}$, $b_3^{2i}$, $b_2^{2i+1}$, and $b_3^{2i+1}$. The repeater 130 still produces $b_0^{2i+1}=b_0^{2i}$.

Figure 10:
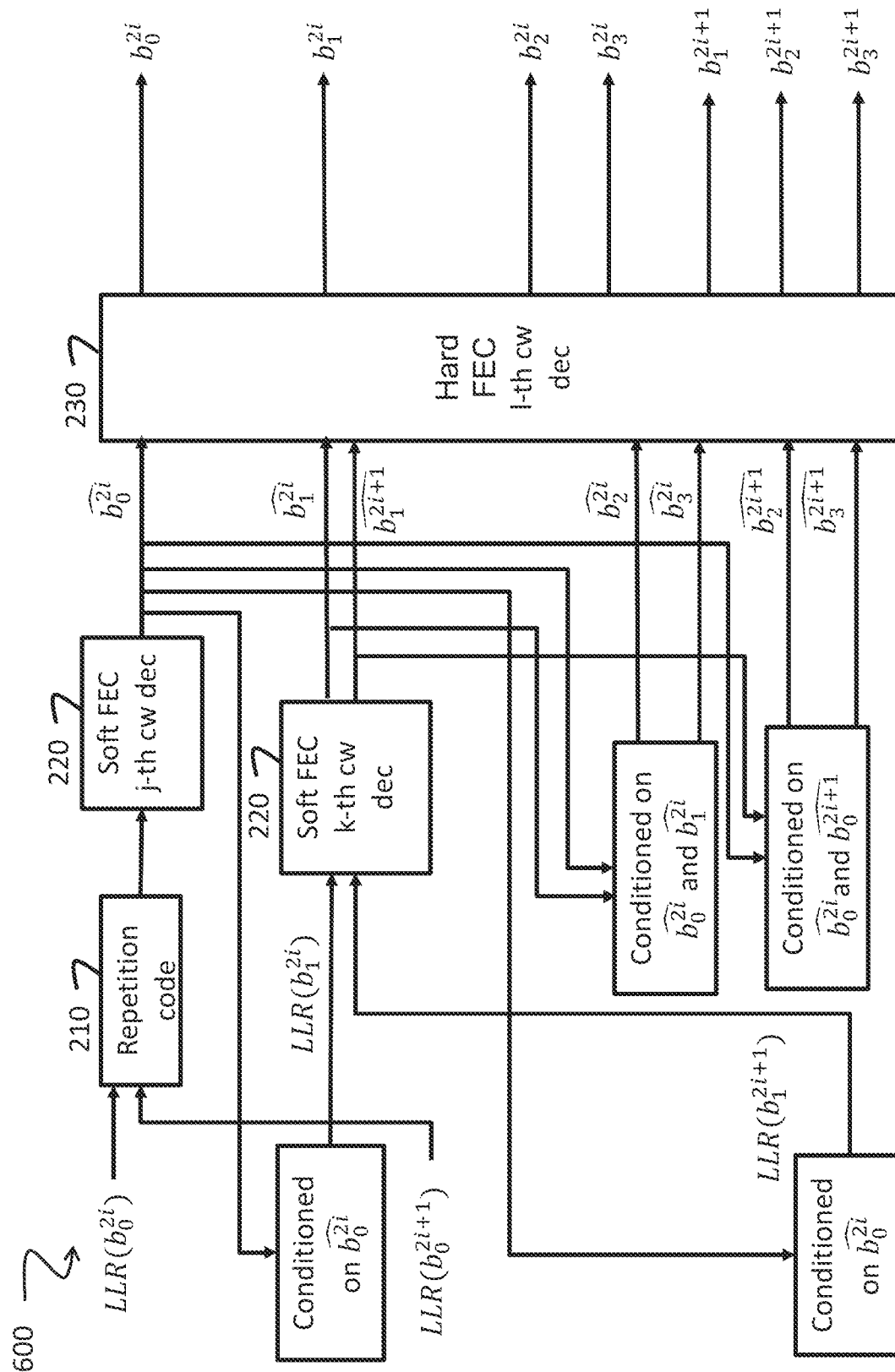
FIG. 10 is a block diagram of a 4D 3-level MLC decoder with concatenated FEC in accordance with an embodiment of the present technology.

FIG. 10 is a block diagram of a 4D 3-level MLC decoder 600 with concatenated FEC. The decoder 600 includes the same or equivalent components as introduced in the description of the decoder 200 (FIG. 6a). One distinction is that the soft FEC decoder 220 produces an estimate of $b_0^{2i}$. The estimate $\widehat{b_0^{2i}}$ satisfies p($\widehat{b_0^{2i}}=b_0^{2i}$)>1−ε, where ε is the input BER threshold of the hard FEC decoder 230 such that the BER at the output of the hard FEC decoder 230 is less than $10^{-15}$. Conditioned on $\widehat{b_0^{2i}}$, the demodulator computes LLR ($b_1^{2i}$) and LLR($b_1^{2i+1}$), which are passed into the soft FEC decoder 220 to produce estimates $\widehat{b_1^{2i}}$ and $\widehat{b_1^{2i+1}}$. Conditioned on $\widehat{b_0^{2i}}$, $\widehat{b_1^{2i}}$, $\widehat{b_1^{2i+1}}$, the demodulator computes $\widehat{b_2^{2i}}$, $\widehat{b_3^{2i}}$, $\widehat{b_3^{2i+1}}$, and $\widehat{b_3^{2i+1}}$. Finally be $\widehat{b_0^{2i}}$, $\widehat{b_1^{2i}}$, $\widehat{b_2^{2i}}$, $\widehat{b_3^{2i}}$, $\widehat{b_1^{2i+1}}$, $\widehat{b_2^{2i+1}}$, and $\widehat{b_3^{2i+1}}$ are all passed to the hard FEC decoder 230 to produce $b_0^{2i}$, $b_1^{2i}$, $b_2^{2i}$, $b_1^{2i+1}$, $b_2^{2i+1}$, and $b_3^{2i+1}$. Comparing the solutions of the 4D 3-level MLC encoder and decoder of FIGS. 5 and 6 with the 4D 3-level MLC encoder and decoder of FIGS. 10 and 11, the application of hard FEC encoding and decoding to all client bits in the latter reduces the amount of work performed by the soft FEC decoder 220, thereby reducing further power consumption at the receiver side.

It may be noted that an embodiment of the encoder may at once include the PCS encoder 140 of FIG. 7 and apply all client bits to the hard FEC encoder 120 as shown on FIG. 9. Equivalently, an embodiment of the decoder may at once apply all bit estimates $\widehat{b_0^{2i}}$, $\widehat{b_1^{2i}}$, $\widehat{b_2^{2i}}$, $\widehat{b_3^{2i}}$, $\widehat{b_1^{2i+1}}$, $\widehat{b_2^{2i+1}}$, and $\widehat{b_3^{2i+1}}$ to the hard FEC decoder 230 as shown on FIG. 10 and include the PCS decoder 240 of FIG. 8.

The above examples have presented examples of 4D 3-level MLC as applied to 16-QAM constellations. 4D 3-level MLC may also be extended to higher order modulation formats, such as 32-QAM, 64-QAM, 128-QAM, 256-QAM, 512-QAM, 1024-QAM, etc. One bit, for example the MSB, is used to define a partition of the entire set of constellation points into two non-overlapping subsets $S_0$ and $S_1$, which correspond to constellation points with $b_0=0$ and $b_0=1$, respectively. In this manner, the minimum Euclidean distances in $S_0$ and $S_1$ are both $\sqrt{2}d_{min}$, where $d_{min}$ is the minimum Euclidean distance of the entire constellation. Another bit, for example the second MSB, is used to define a further partition of $S_0$ and $S_1$ to produce $S_{00}$, $S_{01}$, $S_{10}$, and $S_{11}$, such that the minimum Euclidean distances in each subset is 2 $d_{min}$. An encoding/decoding architecture similar to that of 16-QAM follows to complete the 4D 3-level MLC design for a higher order modulation format.

Figure 11:
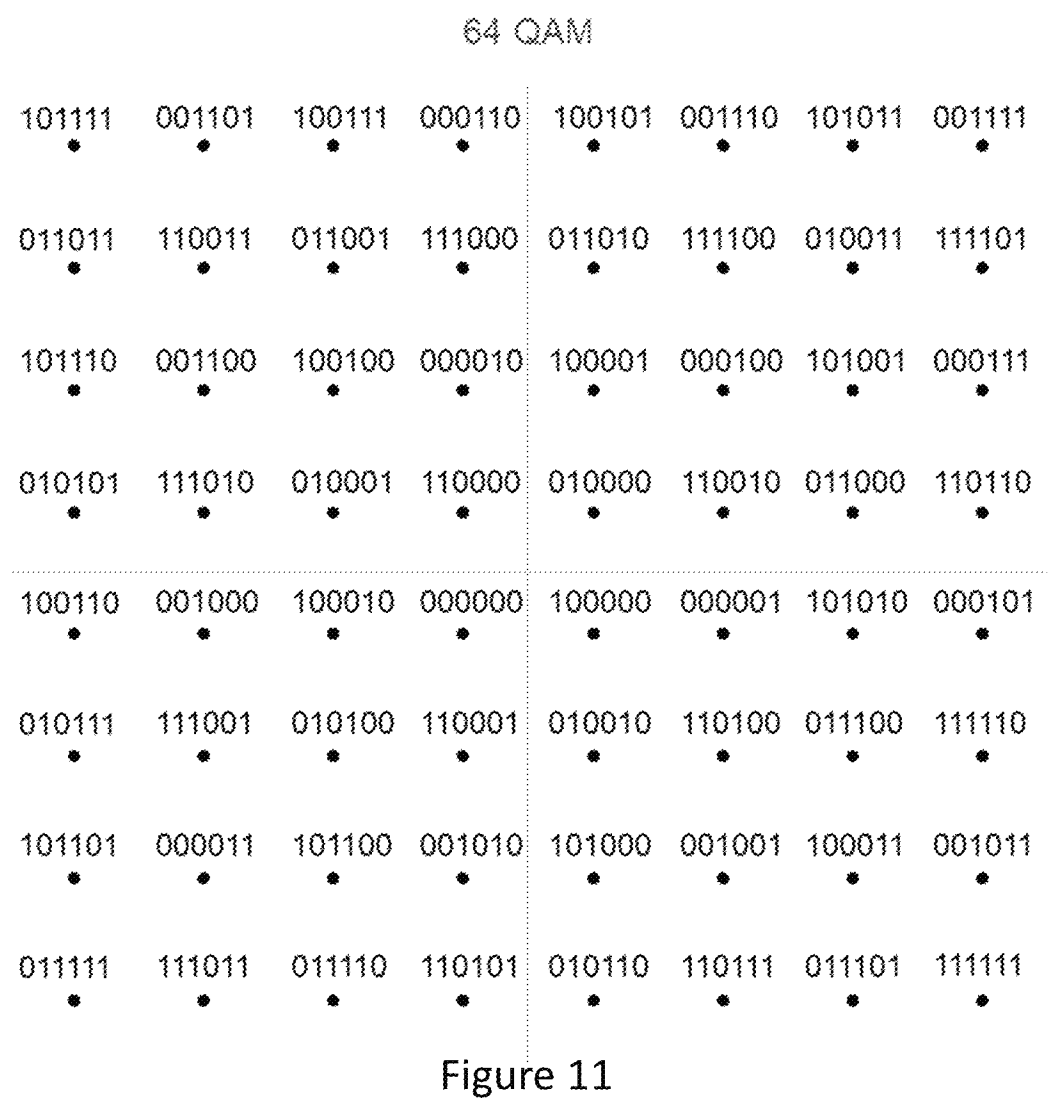

FIG. 11 is an example of 64-QAM labeling scheme that may benefit from 4D 3-level MLC encoding and decoding. The repetition code of length 2 may be replaced by other simple short block codes to extend the design to even higher dimensions. For example, if the repetition code of length 2 is replaced at the SPC generator 131 (FIG. 5*b*) by a SPC code of length 3 applied to ⅔ of a set of soft FEC encoded bits for generating a parity bit, a 6D MLC solution is obtained, with ⅚ bits/complex symbol decoded by the soft FEC, providing ⅙ soft FEC decoder power saving. Three associated labels comprise (i) a first label including a first MSB of the first label, a second MSB of the first label, and two or more LSBs of the first label, (ii) a second label including a first MSB of the second label, a second MSB of the second label, and two or more LSBs of the second label, and (iii) a third label including the parity bit, a second MSB of the third label, and two or more LSBs of the third label.

If the repetition code of length 2 is replaced by a repetition code of length 3 applied to ¼ of a set of soft FEC encoded bits for generating two parity bits, a 6D MLC solution is obtained, with ⅘ bits/complex symbol decoded by the soft FEC, providing ⅓ soft FEC decoder power saving. Three associated labels comprise (i) a first label including a first MSB of the first label, a second MSB of the first label, and two or more LSBs of the first label, (ii) a second label including one of the parity bits, a second MSB of the second label, and two or more LSBs of the second label, and (iii) a third label including the other parity bit, a second MSB of the third label, and two or more LSBs of the third label.

Figure 12:
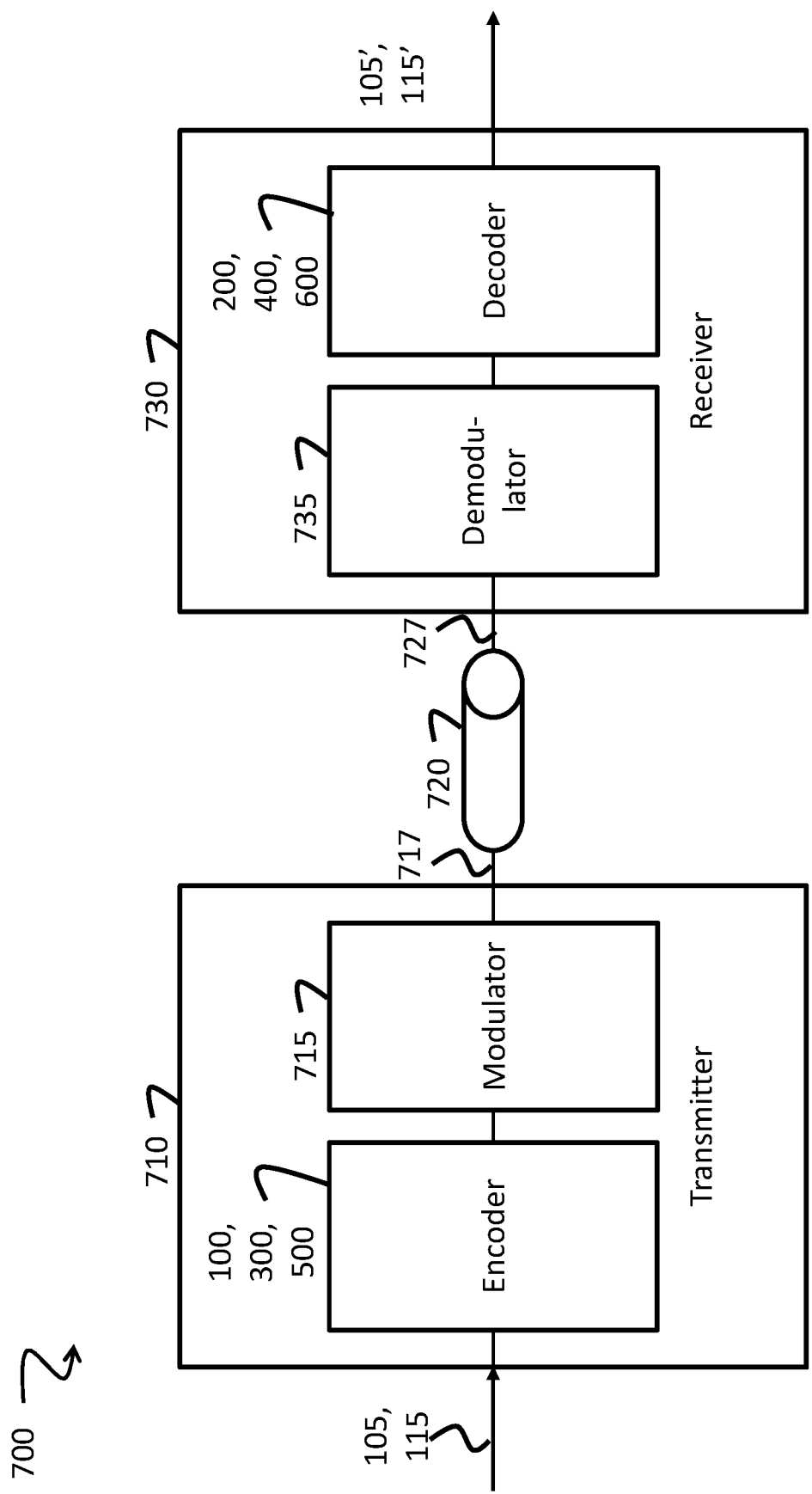
FIG. 12 is a block diagram of a system 700 implementing 4D 3-level MLC encoding and decoding in accordance with an embodiment of the present technology.

FIG. 12 is a block diagram of a system 700 implementing 4D 3-level MLC encoding and decoding. The system 700 includes a transmitter 710 and a receiver 730 connected via a communication channel 720. Client bits 105, 115 are applied to the transmitter 710. In the transmitter one of the 4D 3-level MLC encoders 100, 300 or 500 generates the various bits $b_0^{2i}$, $b_0^{2i+1}$, $b_1^{2i}$, $b_1^{2i+1}$, $b_2^{2i}$, $b_3^{2i}$, $b_2^{2i+1}$, $b_3^{2i+1}$, and the like, in the manner described hereinabove. A modulator 715 modulates a carrier for forwarding a modulated version 717 of these bits on the channel 720. Because of noise and non-linearities in the channel 720, a noisy version 727 of the same bits is received at the receiver 730. In the receiver 730, a demodulator 735 receives and demodulates the noisy version 727 of these bits, calculates LLRs and/or hard estimates of the received noisy bits in the manner described hereinabove. These LLRs and estimates are provided by the demodulator 735 to one of the 4D 3-level MLC decoders 200, 400 or 600 that output recovered client bits 105', 115', which represent the client bits 105, 115 with a BER<$10^{-15}$.

The present high-dimensional MLC may be applied in a variety of communication systems including, for example and without limitation, in high performance, long-haul optical links, low power pluggable optical links, wireless links, and the like. The present high-dimensional MLC may be applied to reduce the power consumption of the FEC module in any application using coherent modulation with 16-QAM or higher modulation formats.

It will be appreciated that the above described hard and soft FEC encoding and decoding, as well as LLR calculations, may also be performed by computer programs, which may exist in a variety of forms both active and inactive. Such as, the computer programs may exist as software program(s) comprised of program instructions in source code, object code, executable code or other formats. Any of the above may be embodied on a computer readable medium, which include storage devices and signals, in compressed or uncompressed form. Representative computer readable storage devices include conventional computer system RAM (random access memory), ROM (read only memory), EPROM (erasable, programmable ROM), EEPROM (electrically erasable, programmable ROM), and magnetic or optical disks or tapes. Representative computer readable signals, whether modulated using a carrier or not, are signals that a computer system hosting or running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general.

It is to be understood that the operations and functionality of the described encoders and decoders, constituent components, and associated processes may be achieved by any one or more of hardware-based, software-based, and firmware-based elements. Such operational alternatives do not, in any way, limit the scope of the present disclosure.

It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A multidimensional multilevel coding (MLC) encoder, comprising:
   a soft forward error correction (FEC) encoder configured to receive a first set of bits for generating a first set of soft FEC encoded bits;
   a redundancy generator configured to receive a subset of the first set of soft FEC encoded bits for generating redundant bits; and
   a hard FEC encoder configured to receive a second set of bits for generating a second set of hard FEC encoded bits;
   combinations of (a) the first set of soft FEC encoded bits, (b) the redundant bits, and (c) the second set of hard FEC encoded bits forming a plurality of labels for mapping to a plurality of constellation points.

2. The MLC encoder of claim 1, wherein:
   the first set of soft FEC encoded bits comprises most significant bits (MSB) of the labels;
   the second set of hard FEC encoded bits comprises least significant bits (LSB) of the labels;
   the redundancy generator is a repeater configured to generate, as a redundant bit, a copy of one third of the first set of soft FEC encoded bits; and
   a pair of associated labels comprises:
   a first label including a first MSB of a first label, a second MSB of the first label, and two or more LSBs of the first label, and
   a second label including a copy of the first MSB of the first label, a second MSB of a second label, and two or more LSBs of the second label.

3. The MLC encoder of claim 2, wherein the bits of the first set of bits received at the soft FEC encoder are selected so that a first minimum Euclidian distance $d'_{min}$ between two labels having the same MSB is greater than a second minimum Euclidian distance $d_{min}$ between the constellation points and so that a third minimum Euclidian distance $d''_{min}$ between two labels having the same 2 MSBs is greater than the first minimum Euclidian distance $d'_{min}$.

4. The MLC encoder of claim 2, wherein the constellation points map on a modulation scheme selected from 16-quadrature amplitude modulation (QAM), 32-QAM, 64-QAM, 128-QAM, 256-QAM, 512-QAM and 1024-QAM.

5. The MLC encoder of claim 1, wherein:
the first set of soft FEC encoded bits comprises most significant bits (MSB) of the labels;
the second set of hard FEC encoded bits comprises least significant bits (LSB) of the labels;
the redundancy generator is a single parity check encoder configured to apply a single parity check code of length 3 to two fifths of the first set of soft FEC encoded bits for generating, as a redundant bit, a parity bit; and
three associated labels comprise:
a first label including a first MSB of the first label, a second MSB of the first label, and two or more LSBs of the first label,
a second label including a first MSB of the second label, a second MSB of the second label, and two or more LSBs of the second label, and
a third label including the parity bit, a second MSB of the third label, and two or more LSBs of the third label.

6. The MLC encoder of claim 1, wherein:
the first set of soft FEC encoded bits comprises most significant bits (MSB) of the labels;
the second set of hard FEC encoded bits comprises least significant bits (LSB) of the labels;
the redundancy generator is a repeater configured to apply a repetition code length 3 to one fourth of the first set of soft FEC encoded bits for generating, as redundant bits, first and second parity bits; and
three associated labels comprise:
a first label including a first MSB of the first label, a second MSB of the first label, and two or more LSBs of the first label,
a second label including the first parity bit, a second MSB of the second label, and two or more LSBs of the second label, and
a third label including the second parity bit, a second MSB of the third label, and two or more LSBs of the third label.

7. The MLC encoder of claim 1, further comprising:
a probabilistic constellation shaping (PCS) encoder configured to:
receive a third set of bits, and
generate the second set of bits received at the hard FEC encoder;
wherein:
the first set of bits have an equal probability of being zeroes or ones,
the third set of bits have an equal probability of being zeroes or ones,
the second set of bits are generated with an unequal probability of being zeroes or ones,
a number of generated bits in the second set of bits is greater than a number of received bits in the third set of bits, and
the hard FEC encoder is further configured to generate parity bits made part of the first set of bits received at the soft FEC encoder.

8. The MLC encoder of claim 1, wherein the first set of bits received at the soft FEC encoder is a first set of hard FEC encoded bits encoded by the hard FEC encoder.

9. The MLC encoder of claim 7, wherein the first set of bits received at the soft FEC encoder is a first set of hard FEC encoded bits encoded by the hard FEC encoder.

10. The MLC encoder of claim 1, wherein:
the first set of soft FEC encoded bits comprises bits of the labels in first bit locations;
the second set of hard FEC encoded bits comprises bits of the labels in second bit locations;
the redundancy generator is a repeater configured to generate a copy of one half of the first set of soft FEC encoded bits; and
a pair of associated labels comprises:
a first label including a first bit of a first label in one of the first bit locations, a second bit of the first label in another one of the first bit locations, and two or more bits of the first label in the second bit locations, and
a second label including a copy of the first bit of the first label in one of the first bit locations, a second bit of the second label in another one of the first bit locations, and two or more bits of the second label in the second bit locations.

11. A transmitter, comprising:
the MLC encoder as defined in claim 1; and
a modulator configured to receive the labels from the MLC encoder and to modulate a carrier by mapping the labels to the constellation points.

* * * * *